US011710529B2

(12) United States Patent
Song et al.

(10) Patent No.: US 11,710,529 B2
(45) Date of Patent: Jul. 25, 2023

(54) THREE-DIMENSIONAL MEMORY DEVICE PROGRAMMING WITH REDUCED DISTURBANCE

(71) Applicant: YANGTZE MEMORY TECHNOLOGIES CO., LTD., Wuhan (CN)

(72) Inventors: Yali Song, Wuhan (CN); Xiangnan Zhao, Wuhan (CN); Yuanyuan Min, Wuhan (CN); Jianquan Jia, Wuhan (CN); Kaikai You, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/871,472

(22) Filed: Jul. 22, 2022

(65) Prior Publication Data
US 2022/0359022 A1  Nov. 10, 2022

Related U.S. Application Data

(63) Continuation of application No. 17/186,456, filed on Feb. 26, 2021, now Pat. No. 11,423,995, which is a
(Continued)

(51) Int. Cl.
*G11C 11/34* (2006.01)
*G11C 16/34* (2006.01)
(Continued)

(52) U.S. Cl.
CPC ...... *G11C 16/3427* (2013.01); *G11C 16/0483* (2013.01); *G11C 16/08* (2013.01); *G11C 16/10* (2013.01); *G11C 16/24* (2013.01)

(58) Field of Classification Search
CPC . G11C 16/3427; G11C 16/0483; G11C 16/08; G11C 16/10
(Continued)

(56) References Cited

U.S. PATENT DOCUMENTS 6,670,241 B1 * 12/2003 Kamal .................. H10B 43/30
                                                438/258
11,205,493 B1   12/2021 Zainuddin et al.
(Continued)

FOREIGN PATENT DOCUMENTS

CN   101552036 A   10/2009
CN   110660437 A    1/2020
(Continued)

OTHER PUBLICATIONS

International Search Report issued in corresponding International Application No. PCT/CN2021/070087, dated Sep. 30, 2021, 4 pages.
(Continued)

*Primary Examiner* — Vu A Le
(74) *Attorney, Agent, or Firm* — Bayes PLLC

(57) ABSTRACT

A 3D memory device may include a first set of memory layers, a second set of memory layers above the first set of memory layers, and a first dummy memory layer between the first and second memory layers. The 3D memory device may include a plurality of NAND memory strings each extending through the first and second set of memory layers and the first dummy memory layer. The 3D memory device may include a word line (WL) driving circuit that, when programming one of the first set of memory layers, may be configured to apply a second pre-charge voltage to the first dummy memory layer during the pre-charge period. The
(Continued)

second pre-charge voltage may overlap with the first pre-charge voltage and ramp down prior to the first pre-charge voltage.

22 Claims, 14 Drawing Sheets

Related U.S. Application Data continuation of application No. PCT/CN2021/070087, filed on Jan. 4, 2021.

(51) Int. Cl.
  *G11C 16/04* (2006.01)
  *G11C 16/08* (2006.01)
  *G11C 16/10* (2006.01)
  *G11C 16/24* (2006.01)

(58) Field of Classification Search
  USPC .................................................. 365/185.02
  See application file for complete search history.

(56) References Cited

U.S. PATENT DOCUMENTS

| | | |
|---|---|---|
| 2008/0158991 A1 | 7/2008 | Hemink et al. |
| 2008/0239812 A1 | 10/2008 | Abiko et al. |
| 2009/0244967 A1 | 10/2009 | Kim et al. |
| 2013/0016577 A1* | 1/2013 | Nagadomi ............. G11C 16/26 365/189.011 |
| 2014/0340964 A1 | 11/2014 | Shiino et al. |
| 2017/0125117 A1 | 5/2017 | Tseng et al. |
| 2017/0133095 A1* | 5/2017 | Park ................... G11C 16/0483 |
| 2017/0140814 A1 | 5/2017 | Punthenthermadam et al. |
| 2019/0189218 A1 | 6/2019 | Izumi et al. |
| 2019/0267092 A1 | 8/2019 | Joe et al. |
| 2020/0006379 A1 | 1/2020 | Nishikawa et al. |
| 2020/0168276 A1 | 5/2020 | Yang |
| 2020/0312413 A1 | 10/2020 | Wang et al. |
| 2020/0381065 A1 | 12/2020 | Joe et al. |
| 2021/0225866 A1 | 7/2021 | Lu et al. |

FOREIGN PATENT DOCUMENTS

| | | |
|---|---|---|
| CN | 110945592 A | 3/2020 |
| CN | 111033626 A | 4/2020 |

OTHER PUBLICATIONS

International Search Report issued in corresponding International Application No. PCT/CN2021/070088, dated Sep. 28, 2021, 4 pages.

\* cited by examiner

THREE-DIMENSIONAL MEMORY DEVICE PROGRAMMING WITH REDUCED DISTURBANCE

CROSS-REFERENCE TO RELATED APPLICATIONS

This application is a continuation of U.S. application Ser. No. 17/186,456, filed on Feb. 26, 2021, which is a continuation of International Application No. PCT/CN2021/070087, filed on Jan. 4, 2021, entitled "THREE-DIMENSIONAL MEMORY DEVICE PROGRAMMING WITH REDUCED DISTURBANCE," both of which are incorporated by reference in their entireties. This application is also related to U.S. application Ser. No. 17/186,429, filed on Feb. 26, 2021, which is hereby incorporated by reference in its entirety.

BACKGROUND

The present disclosure relates to three-dimensional (3D) memory devices and operation methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

In one aspect, a 3D memory device is disclosed. For example, in certain aspects, the 3D memory device may include a first set of memory layers, a second set of memory layers above the first set of memory layers, and a first dummy memory layer between the first and second memory layers. In certain other aspects, the 3D memory device may include a plurality of NAND memory strings each extending through the first and second set of memory layers and the first dummy memory layer. Each of the NAND memory strings may comprise a drain select gate (DSG) above the second set of memory layers. In still other aspects, the 3D memory device may include a peripheral circuit configured to sequentially program each memory layer of the first set of memory layers, and then sequentially program each of the memory layer of the second set of memory layers. The peripheral circuit may include a DSG driving circuit configured to apply a first pre-charge voltage to the DSG of at least one of the NAND memory strings during a pre-charge period, and to apply a deselect voltage to the DSG of the at least one of the NAND memory strings during a program period to deselect the at least one of the NAND memory strings. In certain other aspects, the 3D memory device may include a word line (WL) driving circuit that, when programming one of the first set of memory layers, may be configured to apply a second pre-charge voltage to the first dummy memory layer during the pre-charge period. The second pre-charge voltage may overlap with the first pre-charge voltage and ramping down prior to the first pre-charge voltage. The WL driving circuit may be further configured to apply a first channel pass voltage to the first dummy memory layer during the program period.

In another aspect, the 3D memory device may include a first set of memory layers, a second set of memory layers below the first set of memory layers, and a first dummy memory layer between the first and second memory layers. In certain aspects, the 3D memory device may include a plurality of NAND memory strings each extending through the first and second set of memory layers and the first dummy memory layer. Each of the NAND memory strings may comprise a source select gate (SSG) below the second set of memory layers. In certain other aspects, the 3D memory device may include a peripheral circuit configured to sequentially program each memory layer of the first set of memory layers, and then sequentially program each of the memory layer of the second set of memory layers. In certain aspects, the peripheral circuit may include the SSG driving circuit configured to apply a first pre-charge voltage to the SSG of at least one of the NAND memory strings during a pre-charge period, and to apply a deselect voltage to the SSG of the at least one of the NAND memory strings during a program period to deselect the at least one of the NAND memory strings. In certain aspects, the peripheral circuit may include a WL driving circuit that, when programming one of the first set of memory layers, may be configured to apply a second pre-charge voltage to the first dummy memory layer during the pre-charge period. In certain implementations, the second pre-charge voltage may overlap with the first pre-charge voltage. In still other aspects, the WL driving circuit may be configured to apply a first channel pass voltage to the first dummy memory layer during the program period.

In yet another aspect, a method for operating a 3D memory device is disclosed. The 3D memory device may include a first set of memory layers, a second set of memory layers above the first set of memory layers, and a first dummy memory layer between the first and second memory layers. The 3D memory device may include a plurality of NAND memory strings each extending through the first and second set of memory layers and the first dummy memory layer. In certain implementations, each of the NAND memory strings may comprise a drain select gate (DSG) above the second set of memory layers. In certain aspects, the method may include applying a first pre-charge voltage to the DSG of at least one of the NAND memory strings during a pre-charge period. In certain other aspects, the method may include applying a deselect voltage to the DSG of the at least one of the NAND memory strings during a program period to deselect the at least one of the NAND memory strings. In certain other aspects, the method may include applying a second pre-charge voltage to the first dummy memory layer during the pre-charge period. In certain implementations, the second pre-charge voltage may overlap with the first pre-charge voltage and ramping down prior to the first pre-charge voltage. In certain other aspects, the method may include applying a first channel pass voltage to the first dummy memory layer during the program period.

In yet another aspect, a method for operating a 3D memory device is disclosed. The 3D memory device may include a first set of memory layers, a second set of memory layers below the first set of memory layers, and a first dummy memory layer between the first and second memory layers, and a plurality of NAND memory strings each extending through the first and second set of memory layers and the first dummy memory layer. In certain aspects, each of the NAND memory strings may comprise a source select gate (SSG) below the second set of memory layers. In certain aspects, the method may include applying a first pre-charge voltage to the SSG of at least one of the NAND memory strings during a pre-charge period. In certain other aspects, the method may include applying a deselect voltage to the SSG of the at least one of the NAND memory strings during a program period to deselect the at least one of the NAND memory strings. In certain other aspects, the method may include applying a second pre-charge voltage to the first dummy memory layer during the pre-charge period. In certain implementations, the second pre-charge voltage may overlap with the first pre-charge voltage. In certain aspects, the method may include applying a first channel pass voltage to the first dummy memory layer during the program period.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

Figure 1:
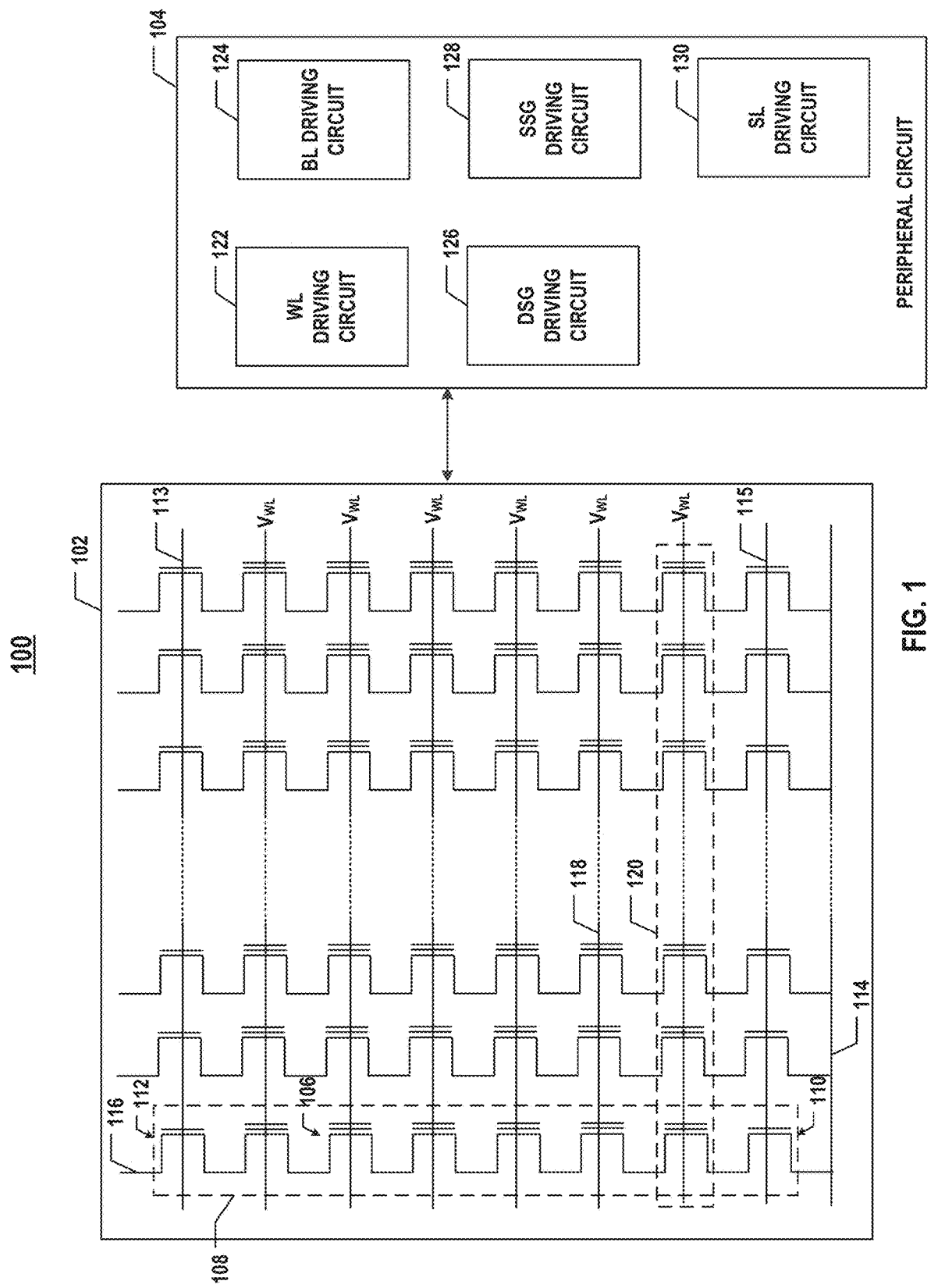
FIG. 1 illustrates a diagram of an exemplary 3D memory device, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means perpendicular to the lateral surface of a substrate.

As the size of memory cells used in 3D memory devices continue to be scaled down, and as more bits are programmed per memory cell, the reliability of 3D memory devices continues to degrade. A key contributor to the reduction of reliability is program disturbance. Program disturbance errors are an intrinsic result of the 3D memory device architecture, such as 3D NAND memory devices. When programming one memory layer, each of the rest of the memory layers is applied with a channel pass voltage to open the channel of the selected NAND memory string, which enables the programming of the memory layer. For each deselected NAND memory strings, by turning off its drain select transistor and source select transistor at each end, the channel of the deselected NAND memory string is in a floating state. As each memory layer surrounds the deselected NAND memory string as well, the channel pass voltage applied to each of the rest of the memory layers forms a coupling potential in the deselected NAND memory string to suppress the programming of the memory layer in the deselected NAND memory string due to the program voltage applied to memory layer. To achieve the desired suppression effect on the program voltage applied to the memory layer, the channel pass voltage needs to be greater than the threshold voltages in order to generate coupling potential.

However, on the other side, a high channel pass-through voltage may induce electric tunneling of free electrons in the channel of the deselected NAND memory string that can shift the threshold voltages of the non-programmed memory cells to higher values due to channel hot electron (CHE) injection, making the coupling potential not sufficient to suppress the programming to the non-programmed memory cell in deselected NAND memory strings, which is known as the program disturbance to deselected NAND memory strings. As the size of memory cells is scaled down further due to the increased memory cell density, the transistor oxide becomes thinner, which in turn increases the tunneling effect and the resulting threshold voltage shift. Also, the use of dual-deck architecture in 3D NAND memory device creates dummy memory layers at the joint interface area between the upper and lower memory decks, which have higher initial threshold voltages and are more susceptible to threshold voltages shift after program cycling than other memory layers. As a result, the program disturbance becomes a more serious issue, in particular for memory cells in the lower memory deck. Moreover, residual, free electrons may accumulate in the channels of deselected NAND memory strings as more programming cycles being applied. The residual electrons with negative charges may also suppress the coupling potential generated in deselected NAND memory strings, thereby worsening the program disturbance.

To address the aforementioned issues, the present disclosure introduces a solution in which the program disturbance can be reduced when programming 3D memory devices, such as 3D NAND memory devices. The programming scheme disclosed herein may add a pre-charge period before applying the program/channel pass voltages in each program cycle in order to reduce or even remove free electrons accumulated in the channel of each deselected NAND memory string to reduce or even eliminate the impact of the free electrons on the coupling potential when actual programming occurs.

For example, the 3D memory device of the present disclosure applies positive biases (pre-charge voltages) to one end (e.g., the source end or the drain end depending on whether the programming direction is forward or reverse) of a deselected memory string (e.g., non-programmed) as well as the dummy memory layers in the middle. The bias at the end of the deselect NAND memory string can create a potential that may draw the residual electrons away from the memory cells and towards the positive bias, thereby reducing the program disturbance that may otherwise occur. Moreover, by ramping down the pre-charge voltage of the middle dummy memory layer prior to that applied to the source/drain end, the residual electrons may continue to be drawn away from the source/drain end even after the pre-charge voltage is removed from the middle dummy memory layers, but cannot go back to the memory layers on which the programming voltage is to be applied because the channel at the middle dummy memory layers has been cut off first. In this way, the 3D memory device of the present disclosure programs memory cells in a way that reduces and/or eliminates program disturbances, thereby improving the reliability and/or lifetime of the 3D memory device, e.g., as described below in connection with FIGS. 3A-6. As used herein, when programming a memory layer, the memory cell associated with and/or control by the memory layer is actually programmed.

FIG. 1 illustrates a diagram of an exemplary 3D memory device 100, according to some aspects of the present disclosure. 3D memory device 100 can include a memory array device 102 and a peripheral circuit 104 connected to memory array device 102. Memory array device 102 can be a 3D NAND Flash memory device in which memory cells 106 are provided in the form of an array of NAND memory strings 108 each extending vertically above a substrate (not shown). In some implementations, each NAND memory string 108 includes a plurality of memory cells 106 connected in series and stacked vertically. Each memory cell 106 can hold a continuous, analog value, such as an electrical voltage or charge, that depends on the number of electrons trapped within a region of memory cell 106. Each memory cell 106 can be either a floating gate type of memory cell including a floating-gate transistor or a charge trap type of memory cell including a charge-trap transistor.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1, each NAND memory string 108 can include a source select gate (SSG) 110 at its source end and a drain select gate (DSG) 112 at its drain end. SSG 110 and DSG 112 can be configured to activate selected NAND memory strings 108 (columns of the array) during reading and programming operations. In some implementations, SSGs 110 of NAND memory strings 108 in the same memory block are connected through a same source line (SL) 114, e.g., a common SL, for example, to the ground. DSG 112 of each NAND memory string 108 is connected to a respective bit line 116 from which data can be read via an output bus (not shown), according to some implementations. In some implementations, each NAND memory string 108 is configured to be selected or deselected by applying a select voltage (e.g., above the threshold voltage of DSG 112) or a deselect voltage (e.g., 0 V) to respective DSG 112 through one or more DSG lines 113 and/or by applying a select voltage (e.g., above the threshold voltage of SSG 110) or a deselect voltage (e.g., 0 V) to respective SSG 110 through one or more SSG lines 115.

Memory cells 106 of adjacent NAND memory strings 108 can be connected through word lines 118 that select which row of memory cells is affected by reading and programming operations. In some implementations, each word line 118 is connected to a page of memory cells (memory page 120), which is the smallest physically-addressable data unit for reading and programming operations. The size of memory page 120 in bits can correspond to the number of NAND memory strings 108 connected by word line 118. Each word line 118 can include a plurality of control gates at each memory cell 106 in respective memory page 120 and a gate line connecting the control gates.

Figure 2:
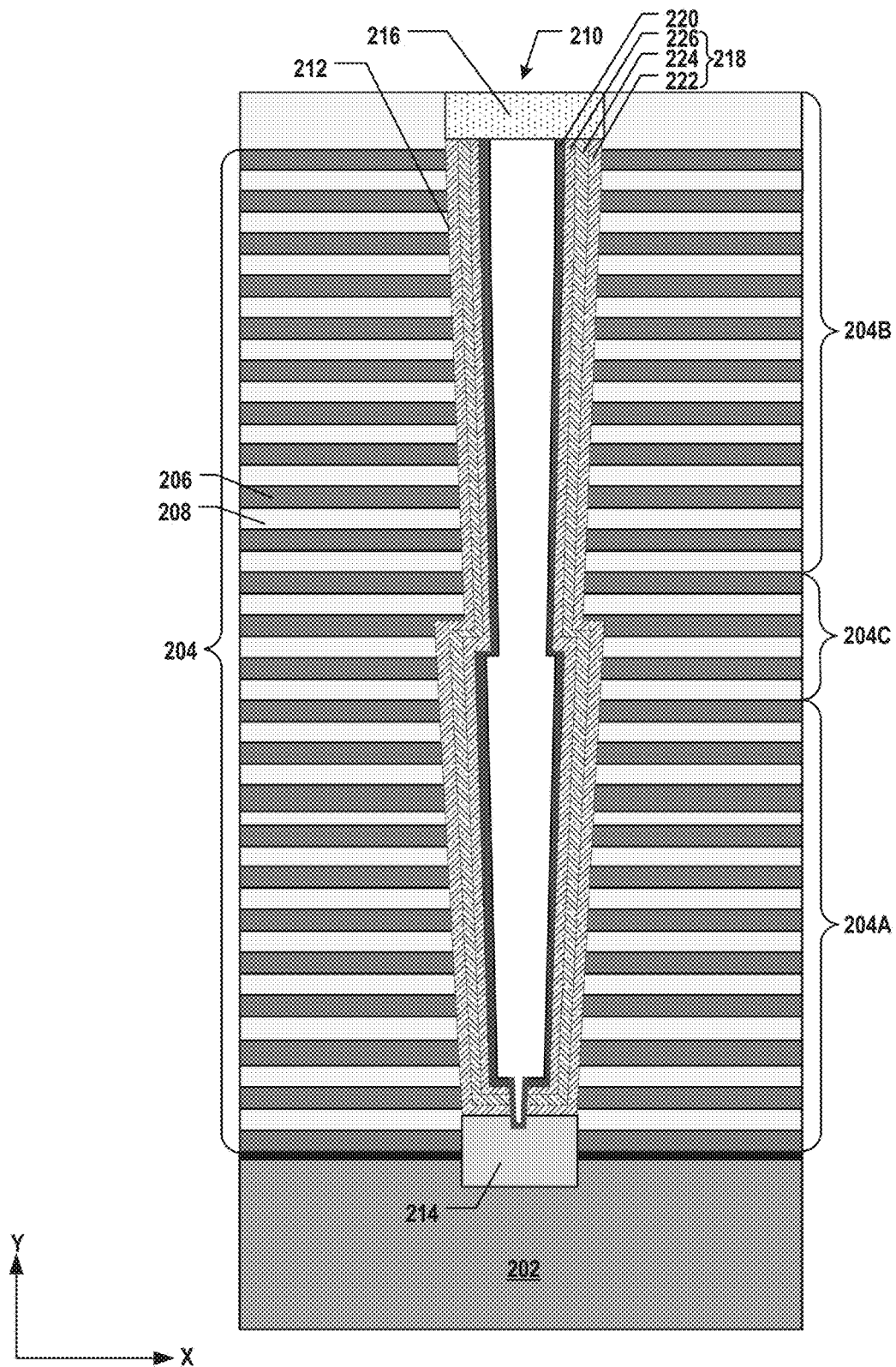
FIG. 2 illustrates a cross-section of an exemplary memory array device, according to some aspects of the present disclosure.

FIG. 2 illustrates a cross-section of an exemplary memory array device 200, according to some aspects of the present disclosure. Memory array device 200 is an example of memory array device 102 illustrated in FIG. 1. As shown in FIG. 2, memory array device 200 includes a 3D NAND memory string 210 (e.g., NAND memory string 108 in FIG. 1) extending vertically above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x and y axes are included in FIG. 2 to further illustrate the spatial relationship of the components in memory array device 200. Substrate 202 includes two lateral surfaces (e.g., a top surface and a bottom surface) extending laterally in the x-direction (i.e., the lateral direction). As used herein, whether one component is "on," "above," or "below" another component of a semiconductor structure (e.g., memory array device 200) is determined relative to the substrate of the semiconductor structure (e.g., substrate 202) in the y-direction (i.e., the vertical direction or depth direction) when the substrate is positioned in the lowest plane of the semiconductor structure in the y-direction. The same notion for describing the spatial relationship is applied throughout the present disclosure.

As shown in FIG. 2, 3D NAND memory string 210 extends vertically through a memory stack 204 having interleaved gate conductive layers 206 (also referred to herein as memory layers) and gate-to-gate dielectric layers 208 above substrate 202. Gate conductive layers 206 and gate-to-gate dielectric layers 208 in memory stack 204 can alternate in the vertical direction. In other words, except the ones at the top or bottom of memory stack 204, each gate conductive layer 206 can be adjoined by two gate-to-gate dielectric layers 208 on both sides, and each gate-to-gate dielectric layer 208 can be adjoined by two gate conductive layers 206 on both sides. The number of the pairs of gate conductive layers 206 and gate-to-gate dielectric layers 208 in memory stack 204 (e.g., 32, 64, 96, or 128) determines the number of memory cells in memory array device 200. Each gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer/memory layer 206 can include control gates surrounding the memory cells (e.g., memory cells 106 in FIG. 1) of 3D NAND memory string 210 and can extend laterally as a word line (e.g., word lines 118 in FIG. 1).

Memory stack 204 can have a multi-deck architecture, such as a dual-deck memory stack including a lower memory deck 204A above substrate 202 and an upper memory deck 204B above lower memory deck 204A, as shown in FIG. 2. The numbers of the pairs of gate conductive layers 206 and gate-to-gate dielectric layers 208 in each of lower and upper memory decks 204A and 204B can be the same or different. Each of lower and upper memory decks 204A and 204B can include interleaved gate conductive layers 206 and gate-to-gate dielectric layers 208 as described above.

As shown in FIG. 2, 3D NAND memory string 210 includes a channel structure 212 extending vertically through lower and upper memory decks 204A and 204B. In some implementations, channel structure 212 includes a channel hole filled with semiconductor material(s) (e.g., as a semiconductor channel 220) and dielectric material(s) (e.g., as a memory film 218). In some implementations, semiconductor channel 220 includes silicon, such as amorphous silicon, polysilicon, or single crystalline silicon. In some implementations, memory film 218 is a composite dielectric layer including a tunneling layer 226, a storage layer 224 (also known as a charge trap/storage layer), and a blocking layer 222. Channel structure 212 can have a cylinder shape (e.g., a pillar shape). Semiconductor channel 220, tunneling layer 226, storage layer 224, blocking layer 222 are arranged radially from the center toward the outer surface of the pillar in this order, according to some implementations. Tunneling layer 226 can include silicon oxide, silicon oxynitride, or any combination thereof. Storage layer 224 can include silicon nitride, silicon oxynitride, silicon, or any combination thereof. Blocking layer 222 can include silicon oxide, silicon oxynitride, high dielectric constant (high-k) dielectrics, or any combination thereof. In one example, memory film 218 can include a composite layer of silicon oxide/silicon oxynitride/silicon oxide (ONO).

In some implementations, 3D NAND memory string 210 further includes a semiconductor plug 214 in the lower portion (e.g., at the lower end) of 3D NAND memory string 210. Semiconductor plug 214 can include a semiconductor material, such as single-crystal silicon, which is epitaxially grown from substrate 202 in any suitable direction. Semiconductor plug 214 can function as part of the channel of a source select transistor (e.g., the transistor having SSG 110 in FIG. 1) of 3D NAND memory string 210. In some implementations, 3D NAND memory string 210 further includes a channel plug 216 in the upper portion (e.g., at the upper end) of 3D NAND memory string 210. In some implementations, channel plug 216 can function as the channel of a drain select transistor (e.g., the transistor having DSG 112 in FIG. 1) of 3D NAND memory string 210. As used herein, the upper end of a component (e.g., channel structure 212) is the end farther away from substrate 202 in the y-direction, and the lower end of the component (e.g., channel structure 212) is the end closer to substrate 202 in they-direction when substrate 202 is positioned in the lowest plane of memory array device 200.

In some implementations, 3D NAND memory strings 210 include a plurality of control gates (each being part of gate conductive layer/memory layer 206) for memory cells of 3D NAND memory strings 210. Gate conductive layer 206 can include multiple control gates for multiple 3D NAND memory strings 210 and can extend laterally as a word line ending at the edge of memory stack 204, which can receive word line bias voltages $V_{WL}$ (e.g., as shown in FIG. 1) for controlling operations of the memory cells, e.g., by reading, erasing, and programming operations. It is understood that although not shown in FIG. 2, additional components of memory array device 200 can be formed including, but not limited to, gate line slits/source contacts, local contacts, interconnect layers, etc.

In FIG. 2, 3D NAND memory string 210 includes single channel structure 212, which is known as a single-cell formation (SCF) structure. It is understood that in some implementations, 3D NAND memory string 210 may include two channel structures electrically connected by an inter-deck plug (not shown), which is also known as a dual-cell formation (DCF) structure. It is also understood that in some implementations, memory stack 204 may include more than two memory decks, and 3D NAND memory string 210 may include a single channel structure extending vertically through the memory decks or include more than two channel structures, each of which extends vertically through a respective one of the memory decks. For a 3D memory device having a multi-deck memory stack, each of the multiple memory decks can include a plurality of memory layers (e.g., gate conductive layers 206) in the vertical direction. In some implementations, a set of dummy memory layers are formed vertically between adjacent memory decks, such as dummy memory layers 204C vertically between lower and upper memory decks 204A and 204B as shown in FIG. 2, or dummy memory layers (not shown) surrounding the inter-deck plug in a DCF structure. A dummy memory layer can have the same physical structure, but different electrical configuration as a memory layer because the memory cells connected by the dummy memory layer are not used for data storage (i.e., as dummy memory cells).

Referring back to FIG. 1, peripheral circuit 104 can include any suitable digital, analog, and/or mixed-signal circuits used for facilitating the operations of 3D memory device 100. For example, peripheral circuit 104 can include one or more of a data buffer (e.g., a bit line page buffer), a decoder (e.g., a row decoder or a column decoder), a sense amplifier, a driver (e.g., a word line driver), a charge pump, a current or voltage reference, or any active or passive components of the circuits (e.g., transistors, diodes, resistors, or capacitors). In some implementations, peripheral circuit 104 is formed using complementary metal-oxide-semiconductor (CMOS) technology.

In some implementations, peripheral circuit 104 may include, among others, a word line (WL) driving circuit 122, a bit line (BL) driving circuit 124, a drain select gate (DSG) driving circuit 126, a source select gate (SSG) driving circuit 128, and a source line (SL) driving circuit 130. One or more of WL driving circuit 122, BL driving circuit 124, DSG driving circuit 126, SSG driving circuit 128, and SL driving circuit 130 may implement the programming schemes disclosed herein for programming memory cells 106 in memory array device 102. The waveform of the programming scheme can be provided by peripheral circuit 104 to each memory page 120 through word lines 118 in the form of word line bias voltages $V_{WL}$. As described below in detail, the WL bias voltages $V_{WL}$ that may be applied to word lines 118 include a pre-charge voltage $V_{pre-charge}$, program voltage $V_{PGM}$, channel pass voltage $V_{pass}$, cut-off voltage $V_{cut}$, etc. DSG driving circuit 126 and/or SSG driving circuit 128 may select or deselect a NAND memory string 108 (and memory cells 106 thereof) by applying a select voltage or a deselect voltage to the DSG 112 and/or SSG 110, respectively. DSG driving circuit 126 can also apply pre-charge voltages to DSG 112 via DSG line 113 in forward programming, and SSG driving circuit 128 can also apply pre-charge voltages to SSG 110 via SSG line 115 in reverse programming, as described below in detail. BL driving circuit 124 can apply BL bias voltage to the drain end of a deselected NAND memory string via BL 116 in forward programming, and SL driving circuit 130 can apply an SL bias voltage to the source end of a deselected NAND memory string via SL 114 in reverse programming, as described below in detail.

Figure 3A:
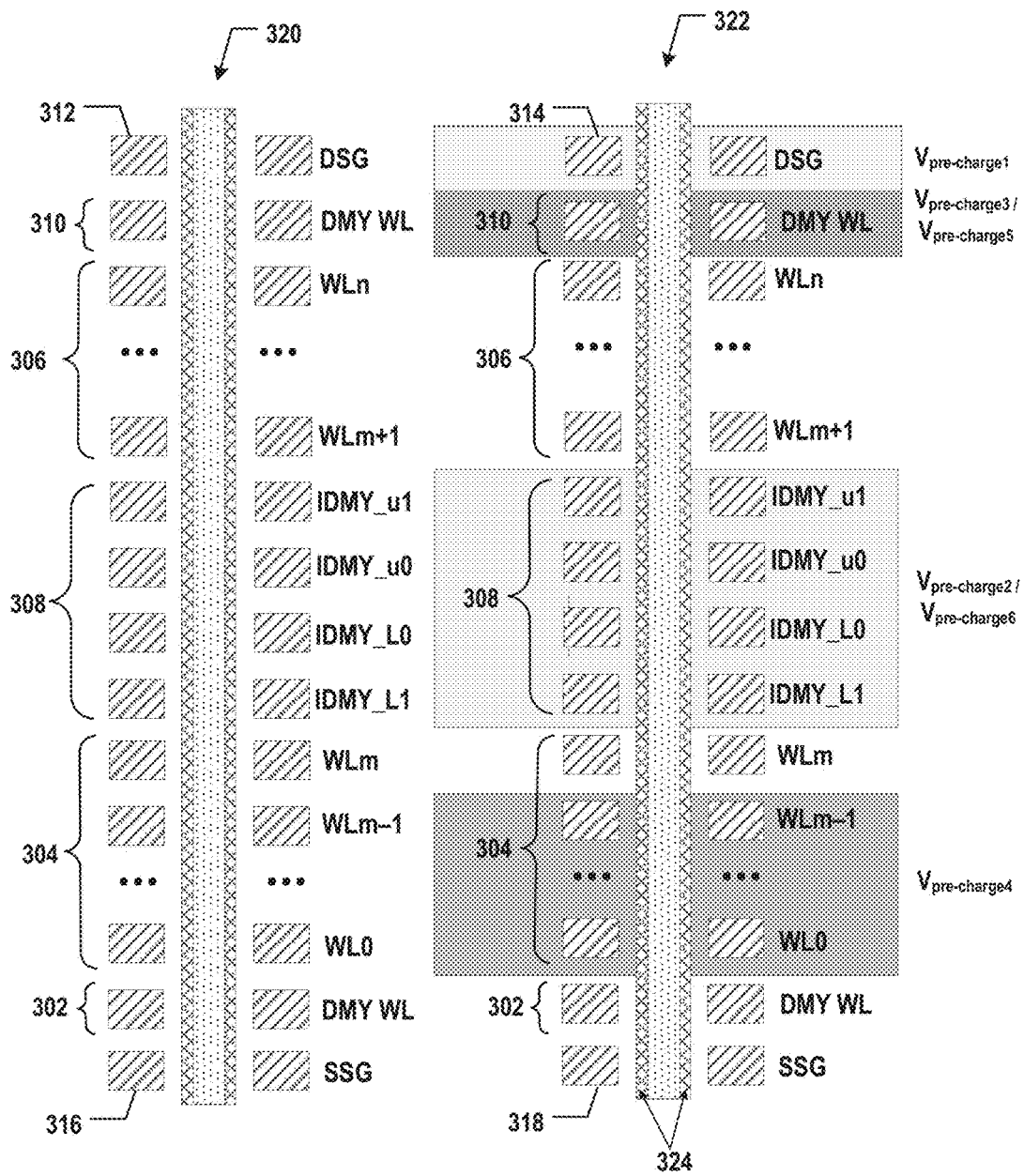
FIG. 3A illustrates a forward pre-charging and programming scheme for a 3D NAND memory device, according to some aspects of the present disclosure.
Figure 3B:
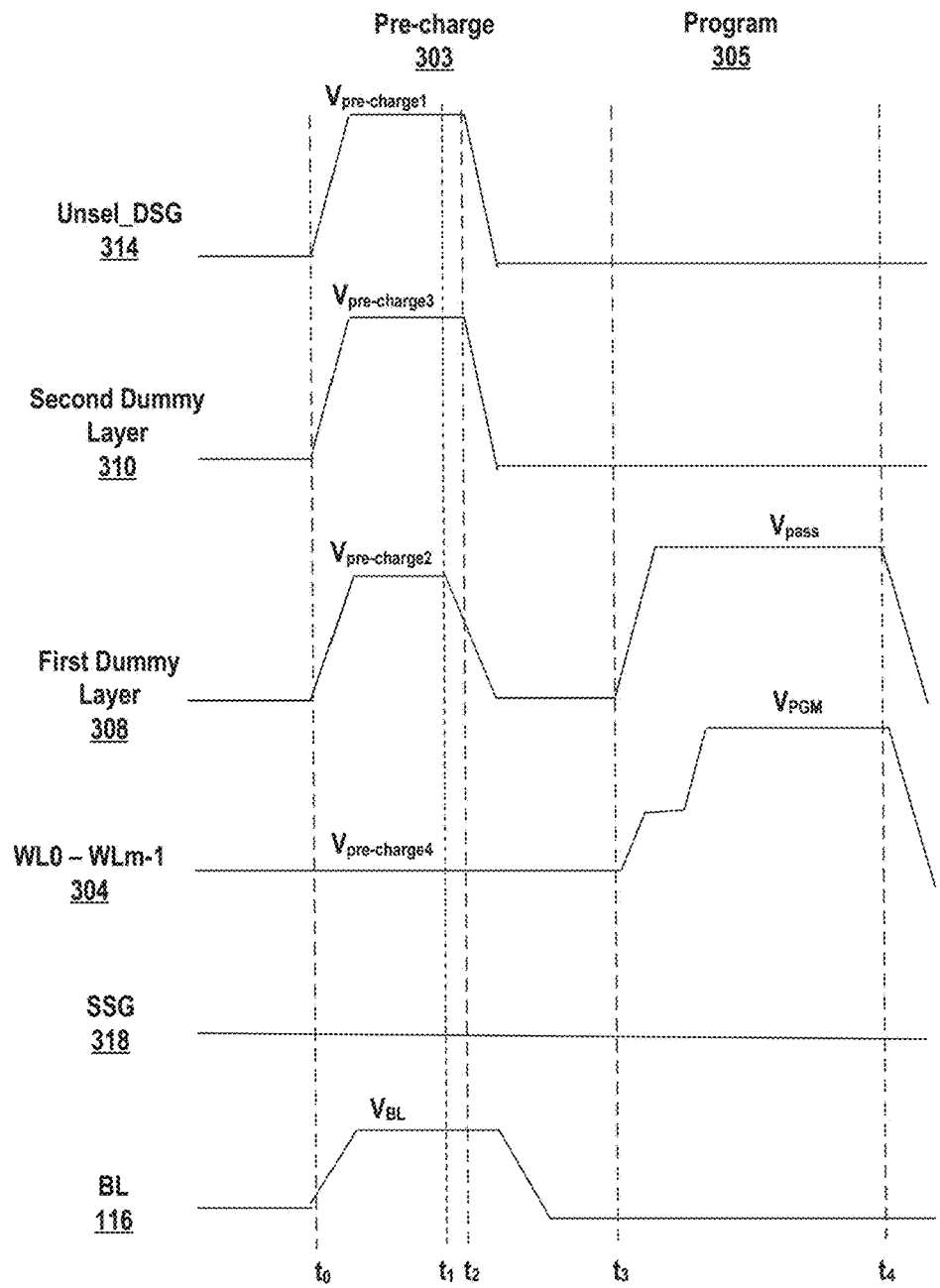
FIG. 3B illustrates a first waveform associated with the forward pre-charging programming scheme for the 3D NAND memory device, according to some aspects of the present disclosure.
Figure 3C:
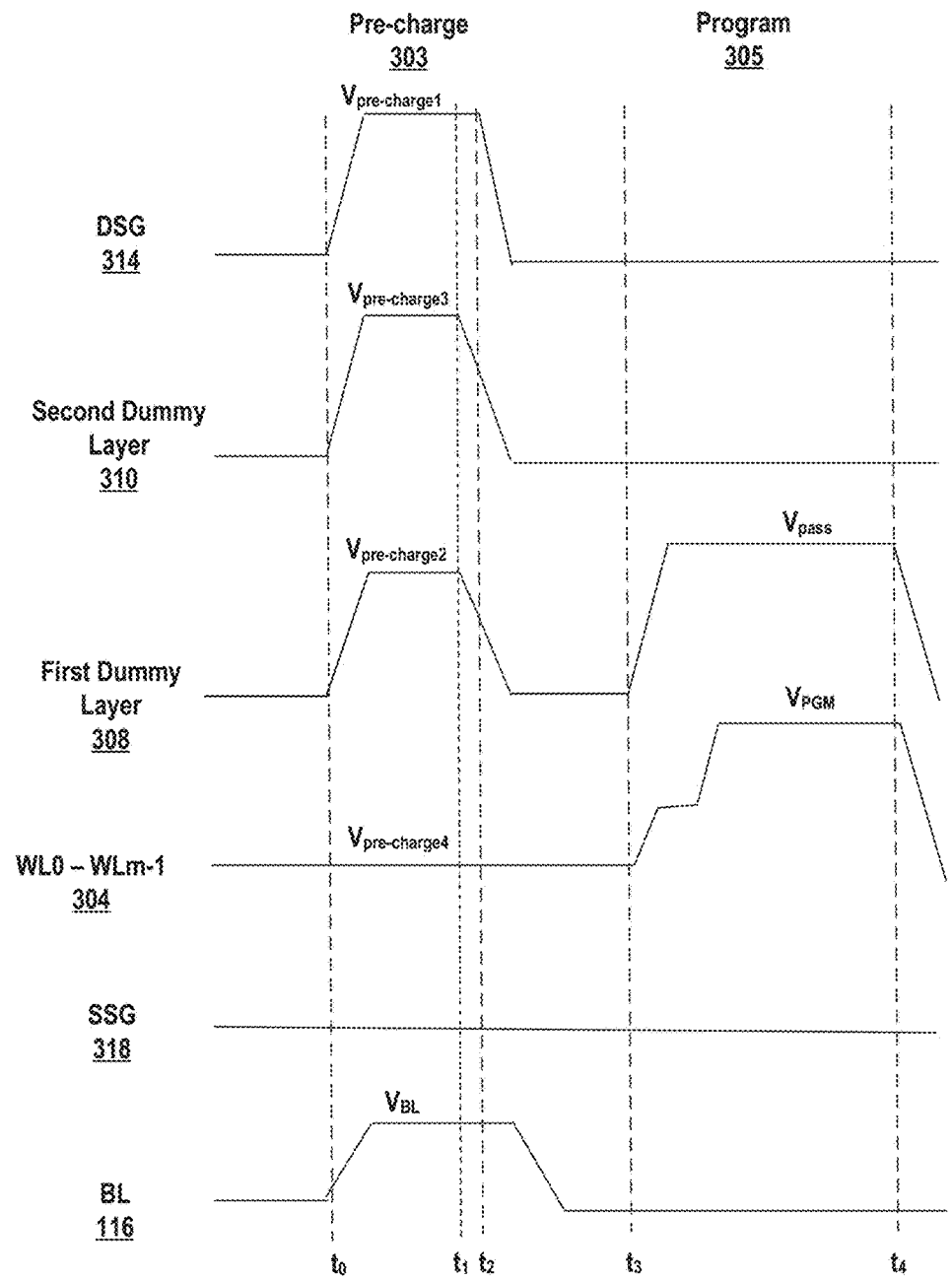
FIG. 3C illustrates a second waveform associated with the forward pre-charging programming scheme for the 3D NAND memory device, according to some aspects of the present disclosure.
Figure 3D:
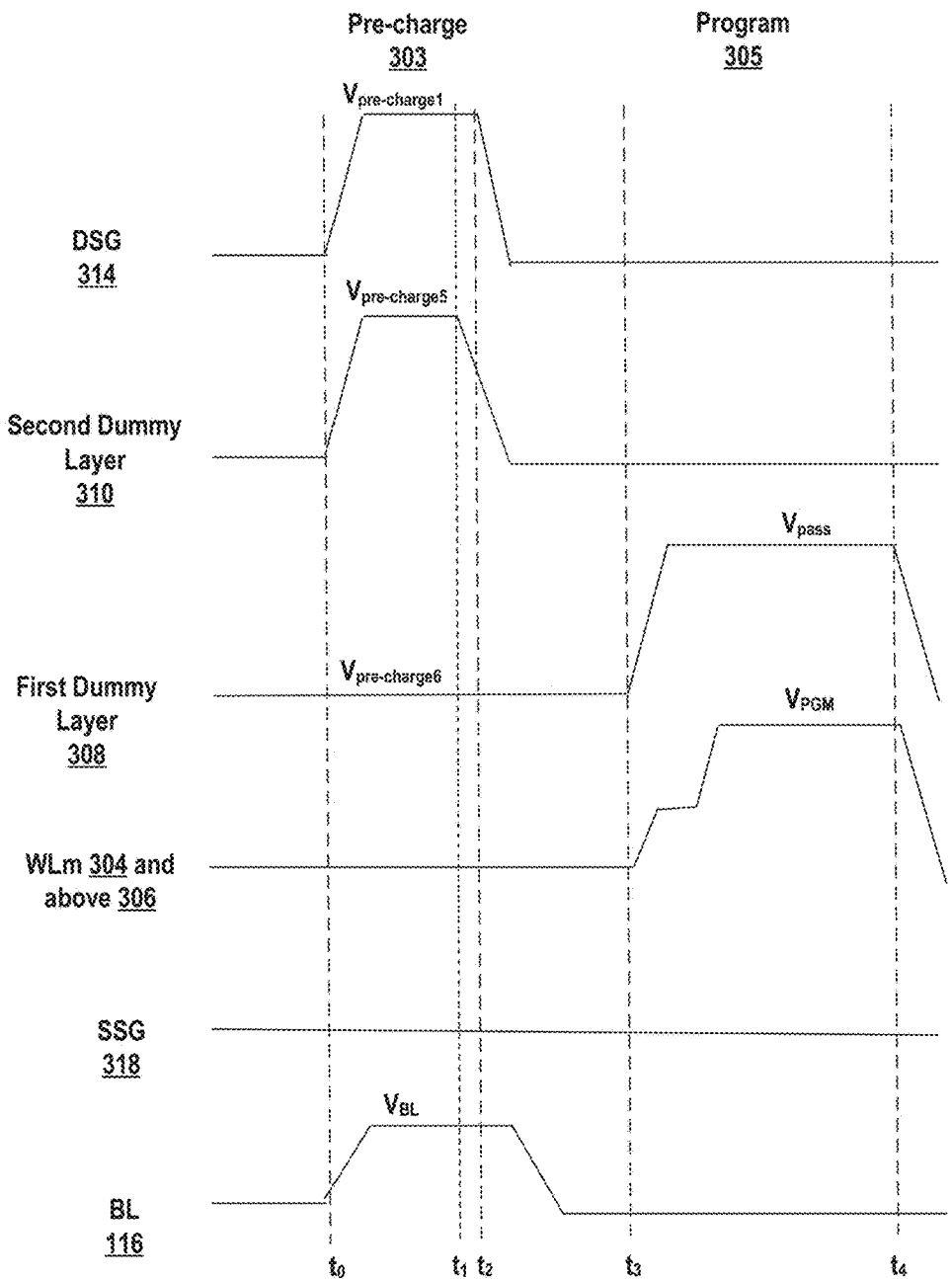
FIG. 3D illustrates a third waveform associated with the forward pre-charging programming scheme for the 3D NAND memory device, according to some aspects of the present disclosure.

FIG. 3A illustrates a forward programming scheme for a 3D NAND memory device 300, according to certain aspects of the present disclosure. FIG. 3B illustrates a first programming waveform 301 associated with 3D NAND memory device 300 of FIG. 3A, according to certain aspects of the present disclosure. FIG. 3C illustrates a second programming waveform 315 associated with the first set of memory layers of 3D NAND memory device 300 of FIG. 3A, according to certain aspects of the present disclosure. FIG. 3D illustrates a third programming waveform 317 associated with a second set of memory layers of 3D NAND memory device 300 of FIG. 3A, according to certain aspects of the present disclosure. FIGS. 3A-3D will now be described together.

Referring to FIG. 3A, 3D NAND memory device 300 includes a memory stack with, e.g., a plurality of memory layers 302, 304, 306, 308, and 310 (e.g., gate conductive layers) in the vertical direction. In certain implementations, the memory stack may be arranged with a first set of memory layers 304 and a second set of memory layers 306. As illustrated in FIG. 3A, each memory layer in first set of memory layers 304 may be associated with a word line, e.g., such as WL0-WLm. Furthermore, each memory layer in second set of memory layers 306 also may be associated with a word line, e.g., such as WLm+1-WLn.

Still further, each memory layer in 3D NAND memory device 300 may be associated with a programming cycle. A programming cycle may include, among others, a pre-charge period 303 and a program period 305. In the forward programming direction, the memory layers in a selected NAND memory string 320 may be programmed. To avoid program disturbances in, for example, a deselected NAND memory string 322, pre-charge voltages may be applied to various layers in deselected NAND memory string 322 prior to program period 305.

By way of example and not limitation, the first programming cycle may begin with the memory layer associated with WL0 before moving on to a second programming cycle for the memory layer associated with WL1, and so on. That is, to program the memory layer associated with WL0 in selected NAND memory string 320, pre-charge voltages are first applied to various layers in deselected NAND memory string 322 of 3D NAND memory device 300. Then, a program voltage is applied to WL0 to program the associated first memory cell in selected NAND memory string 320. Once the first memory cell is programmed in selected NAND memory string 320, a programming cycle for the memory cell associated with WL1 may begin. Each time a memory cell is programmed in selected NAND memory string 320, residual electrons may accumulate in a channel 324 (corresponding to semiconductor channel 220 in FIG. 2) of deselected NAND memory string 322 for the reasons mentioned above. Hence, for each subsequent memory layer, pre-charge voltages may be applied to deselected NAND memory string 322 to remove the residual electrons accumulated during the program period 305 of the previous memory layer. In this way, program disturbances in the deselected NAND memory string 322 may be reduced and/or avoided entirely.

Still referring to FIG. 3A, a first dummy memory layer 308, such as interface dummy word lines (IDMY_L1-IDMY_ul), may be located between first set of memory layers 304 and second set of memory layers 306. As shown in FIG. 3A, 3D NAND memory device 300 also includes a plurality of NAND memory strings (e.g., selected NAND memory string 320 and deselected NAND memory string 322), each extending vertically through the memory stack. Each NAND memory string 320 or 322 includes a drain select gate (DSG) 312 or 314 above second dummy memory layer(s) 310, such as drain dummy word lines (DMY_WL). Each NAND memory string 320 or 322 also includes a source select gate (SSG) 316 or 318 below third dummy memory layer(s) 302, such as source dummy word lines (DMY_WL). A forward programming operation (e.g., programming in the direction from SSG 316/318 to DSG 312/314) may be performed to program one or more memory layers in selected NAND memory string 320. It is understood that each of first, second, and third dummy memory layers 308, 310, and 302 referred to herein may include one or more dummy memory layers.

As illustrated in FIGS. 3B-3D, the forward programming operation may apply $V_{pre-charge1}$ to DSG 314 and a BL voltage $V_{BL}$ to BL 116 to turn on deselected NAND memory string 322 during pre-charge period 303. In certain implementations, DSG driving circuit 126 may apply $V_{pre-charge1}$ to DSG 314 via a DSG line 113 that is associated with deselected NAND memory string 322. In certain other implementations, BL driving circuit 124 may apply $V_{BL}$ to BL 116 of deselected NAND memory string 322.

As mentioned above, the forward programming operation may include a plurality of programming cycles, one for each of the memory layers in 3D NAND memory device 300. Each of the programming cycles may include, among others, pre-charge period 303 and program period 305. In the example(s) illustrated in FIGS. 3B-3D, pre-charge period 303 may be the time period between $t_0$ and $t_3$. During pre-charge period 303, a potential may be created in channel 324 of deselected NAND memory string 322. The potential may draw residual electrons (e.g., located in channel 324 of deselected NAND memory string 322) towards the drain end (e.g., towards DSG 314) by applying various pre-charge voltages to different layers in deselected NAND memory string 322. During the time period between $t_2$ and $t_3$, the pre-charge voltages ramp down prior to program period 305. Program period 305 may be the time period between $t_3$ and $t_4$. During program period 305, an associated memory cell in selected NAND memory string 320 may be programmed, and the coupling potential may be generated in deselected NAND memory string 322 to prevent programming a memory cell in the same memory layer of deselected NAND memory string 322.

Referring to FIG. 3B, DSG driving circuit 126 may apply a first pre-charge voltage $V_{pre-charge1}$ to DSG 314 of deselected NAND memory string 322 during pre-charge period 303. Furthermore, during pre-charge period 303, WL driving circuit 122 may apply a second pre-charge voltage $V_{pre-charge2}$ to first dummy memory layer 308. As illustrated in FIG. 3B, $V_{pre-charge2}$ may overlap with $V_{pre-charge1}$. Namely, for at least a portion of pre-charge period 303, $V_{pre-charge2}$ and $V_{pre-charge1}$ may be applied concurrently. At this overlapped time period, the residual electrons can be drawn away from channel 324 of deselected NAND memory string 322 through its drain end. However, as illustrated in FIG. 3B, WL driving circuit 122 may begin ramping down $V_{pre-charge2}$ at $t_1$, prior to DSG driving circuit 126 ramping $V_{pre-charge1}$, which beings at $t_2$. By ramping down $V_{pre-charge2}$ prior to $V_{pre-charge1}$, residual electrons near and/or around first dummy memory layer 308 may be prevented from flowing back towards the lower memory layers.

As also seen in FIG. 3B, during pre-charge period 303, WL driving circuit 122 may apply a third pre-charge voltage $V_{pre-charge3}$ to second dummy memory layer 310. In certain implementations, $V_{pre-charge3}$ may overlap with $V_{pre-charge1}$ and $V_{pre-charge2}$ during pre-charge period 303. Namely, for at least a portion of pre-charge period 303, $V_{pre-charge3}$, $V_{pre-charge2}$, and $V_{pre-charge1}$ may be applied concurrently. In the example illustrated in FIG. 3B, DSG driving circuit 126 and WL driving circuit 122 may begin ramping down $V_{pre-charge1}$ and $V_{pre-charge3}$, respectively, at the same time, e.g., $t_2$. However, in the example illustrated in FIG. 3C, WL driving circuit 122 may begin ramping down $V_{pre-charge3}$ at $t_1$ prior to DSG driving circuit 126 ramping down $V_{pre-charge1}$ at $t_2$. By ramping down $V_{pre-charge3}$ and $V_{pre-charge2}$ prior to $V_{pre-charge3}$ and $V_{pre-charge1}$, residual electrons may continue to be drawn towards the drain end after the pre-charge voltages are reduced and/or removed from first dummy memory layer 308 and second dummy memory layer 310. In this way, fewer residual electrons may remain in channel 324, and, hence, the chance of program disturbance occurring at the lower memory layers associated with WL0-WLm may be reduced.

Furthermore, as seen in FIGS. 3B and 3C, WL driving circuit 122 may apply a fourth pre-charge voltage $V_{pre-charge4}$ to one of WL0-WLm−1 during pre-charge period 303 associated with that programming cycle. $V_{pre-charge4}$ may be applied in such a way that the potential within channel 324 is enhanced, or at least not affected by the application of $V_{pre-charge4}$. For example, $V_{pre-charge4}$ may be less than or equal to 0 V.

However, during each pre-charge period 303 associated with its respective memory cell (e.g., a memory cell associated with one of WLm-WLn), different pre-charge voltages may be applied to second dummy memory layer 310 and first dummy memory layer 308 than those applied during pre-charge period 303 associated with one of the memory cells between WL0-WLm−1. For example, referring to FIG. 3D, DSG driving circuit 126 may maintain $V_{pre\text{-}charge1}$ at DSG 314, and WL driving circuit 122 may apply a fifth pre-charge voltage $V_{pre\text{-}charge5}$ to second dummy memory layer 310. In certain implementations, $V_{pre\text{-}charge5}$ and $V_{pre\text{-}charge1}$ may be applied concurrently. In certain implementations, WL driving circuit 122 may apply $V_{pre\text{-}charge6}$ first dummy memory layer 308. $V_{pre\text{-}charge6}$ may be 0 V or a negative voltage so that the potential within channel 324 draws free electrons away from lower layer memory cells towards DSG 314. In certain implementations, WL driving circuit 122 may begin ramping down $V_{pre\text{-}charge5}$ at $t_1$ prior to DSG driving circuit 126 ramping down $V_{pre\text{-}charge1}$ at $t_2$.

As seen in FIGS. 3B-3D, during program period 305, for deselected NAND memory string 322, because DSG 314 and SSG 318 at each end thereof are turned off, channel 324 of deselected NAND memory string 322 is in a floating state. During the programming of memory layers in selected NAND memory string 320, because the memory layers of memory pages 120 surround both selected NAND memory string 320 and deselected NAND memory string 322, channel pass voltage $V_{pass}$ applied to each of the rest of the memory layers forms a coupling potential in deselected NAND memory string 322 to suppress the programming of a memory cell in deselected NAND memory string 322 due to the program voltage $V_{PGM}$ used to program a memory cell in selected NAND memory string 320. For example, when $V_{PGM}$ is applied to WLm−1 to program the associated memory cell in selected NAND memory string 320, $V_{pass}$ may be applied to WL0-WLm−2, WLm-WLn, and first dummy memory layer 308. Furthermore, during program period 305, a deselect voltage (e.g., 0V) may be applied to DSG 314 and SSG 318 to deselect NAND memory string 322 while programming the memory cells of selected NAND memory string 320.

Figure 4A:
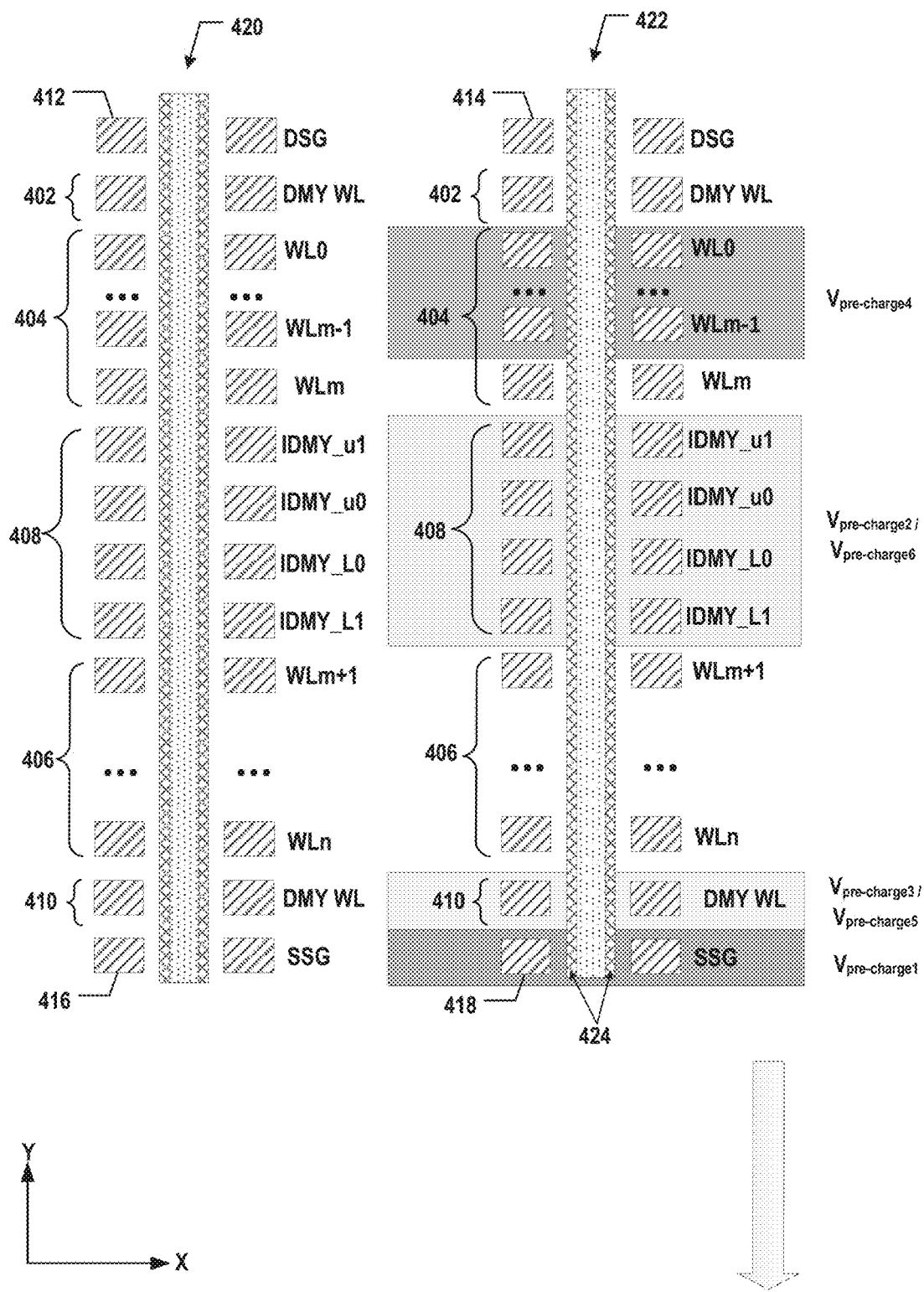
FIG. 4A illustrates a reverse pre-charging and programming scheme for a 3D NAND memory device, according to some aspects of the present disclosure.
Figure 4B:
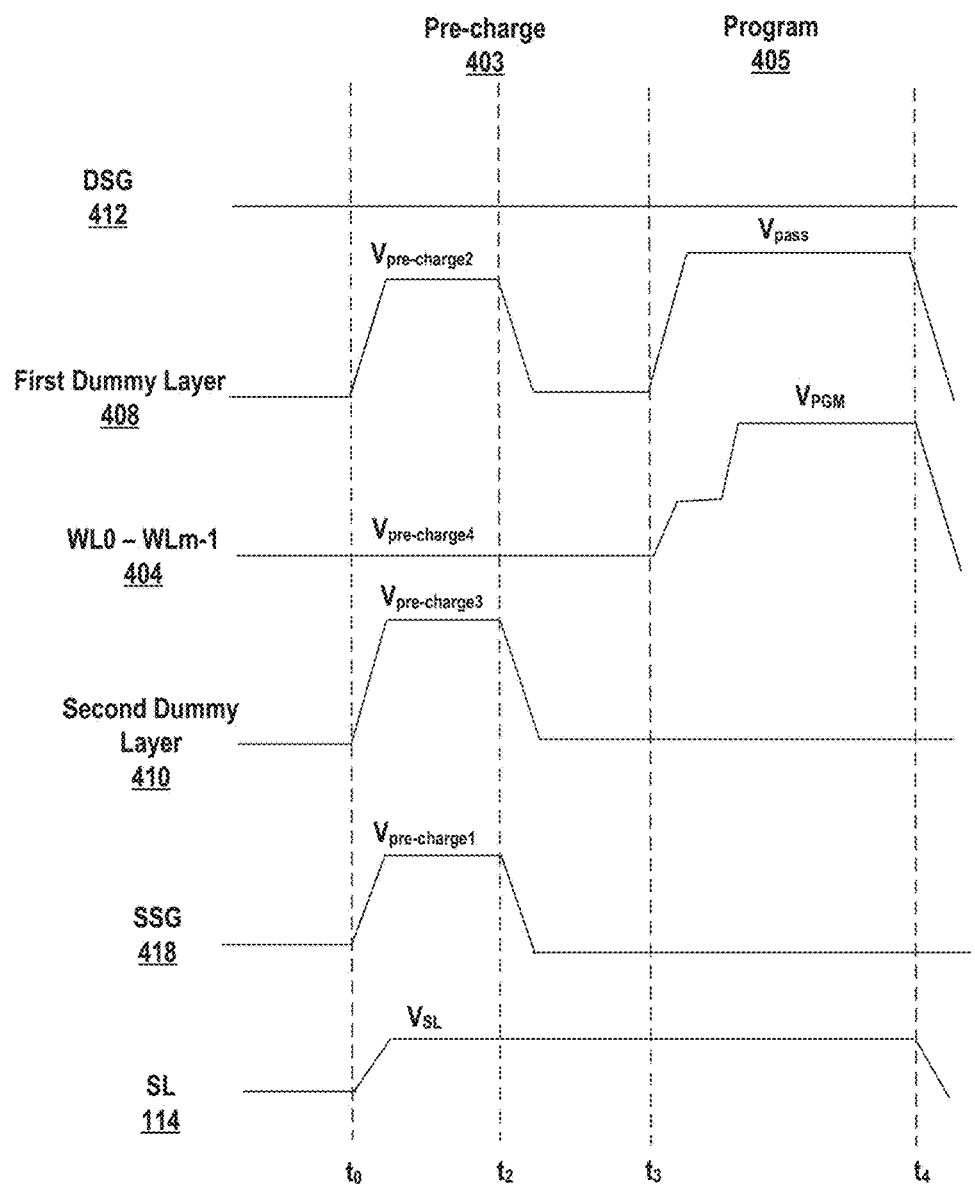
FIG. 4B illustrates a first waveform associated with the reverse pre-charging programming scheme for the 3D NAND memory device, according to some aspects of the present disclosure.
Figure 4C:
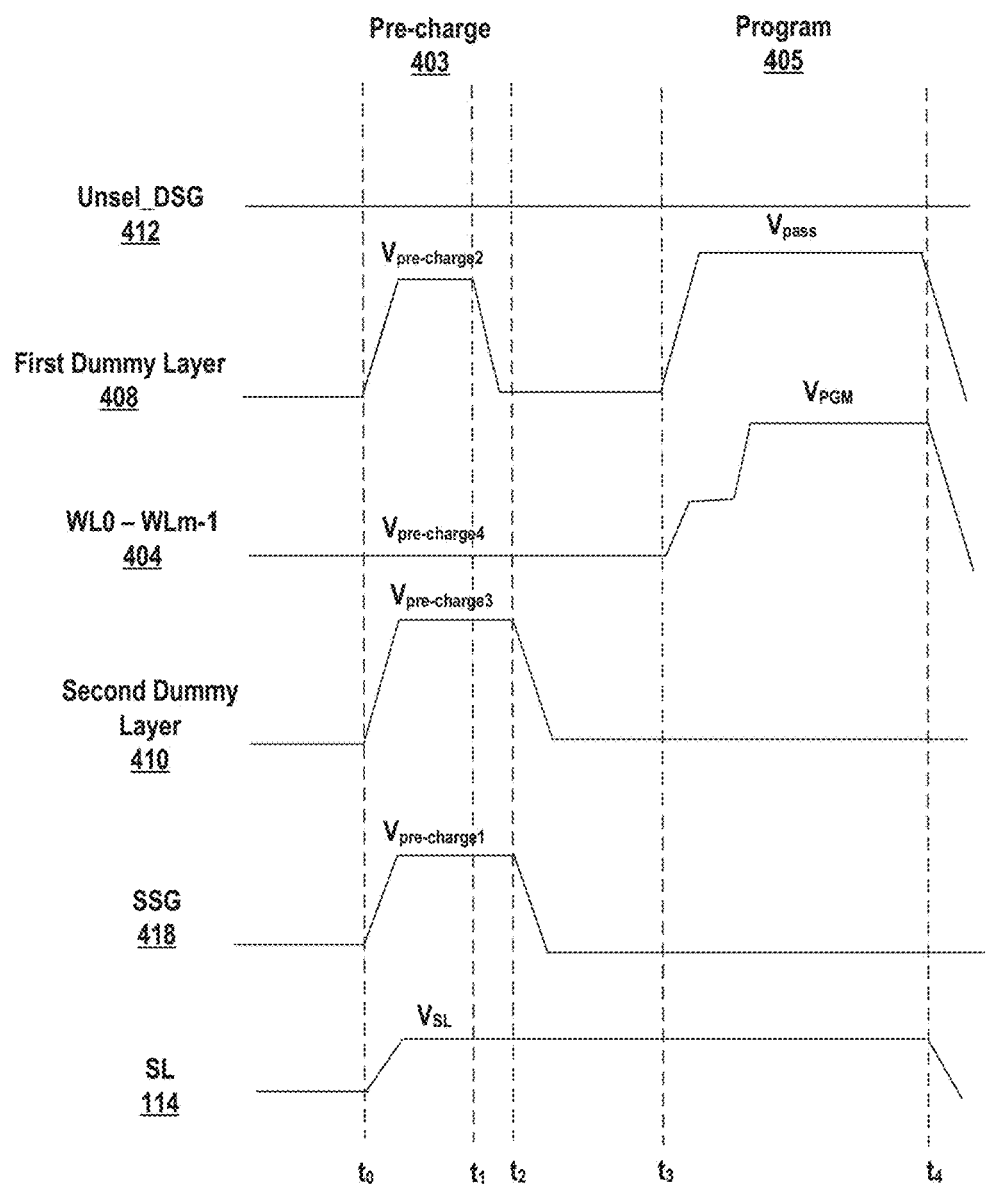
FIG. 4C illustrates a second waveform associated with the reverse pre-charging programming scheme for the 3D NAND memory device, according to some aspects of the present disclosure.
Figure 4D:
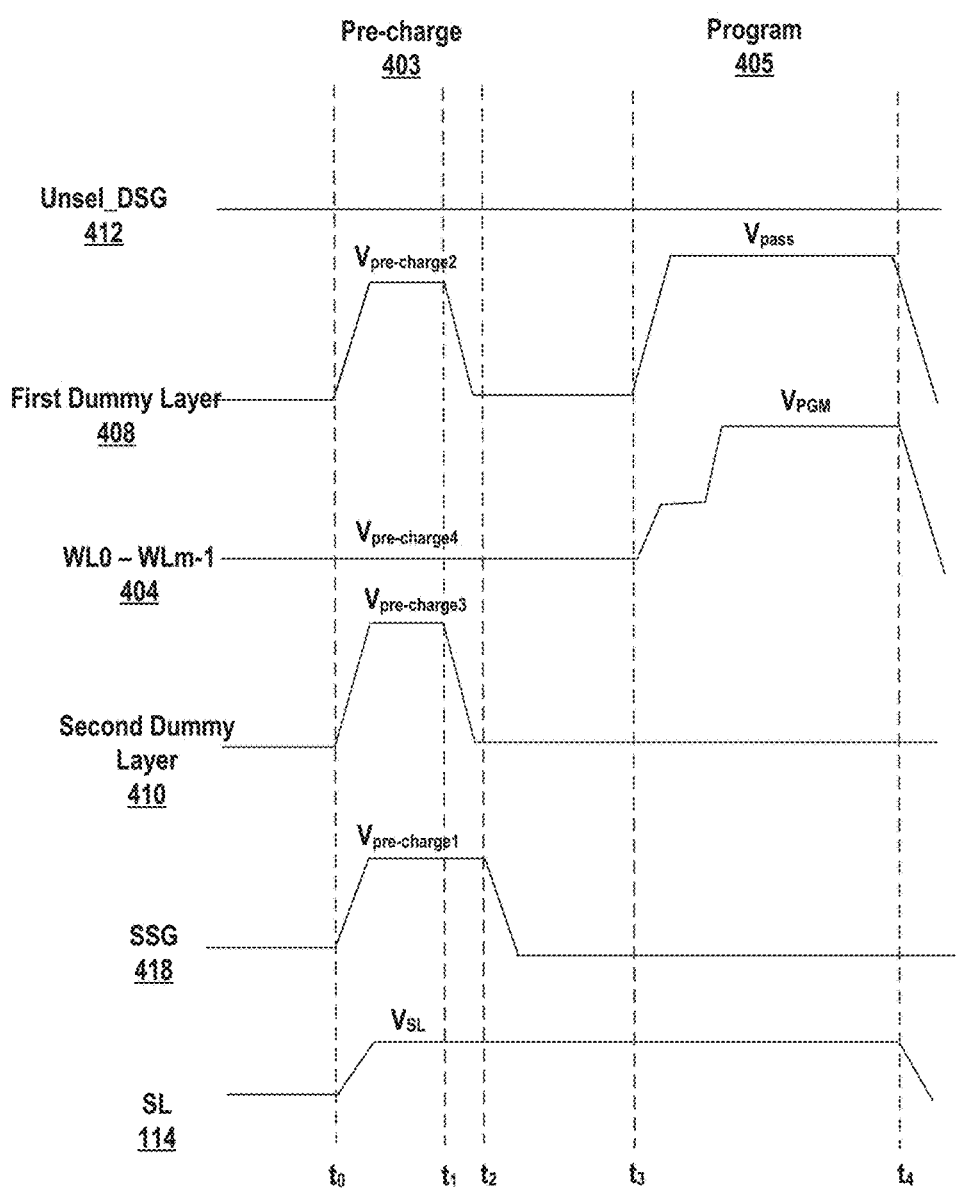
FIG. 4D illustrates a third waveform associated with the reverse pre-charging programming scheme for the 3D NAND memory device, according to some aspects of the present disclosure.
Figure 4E:
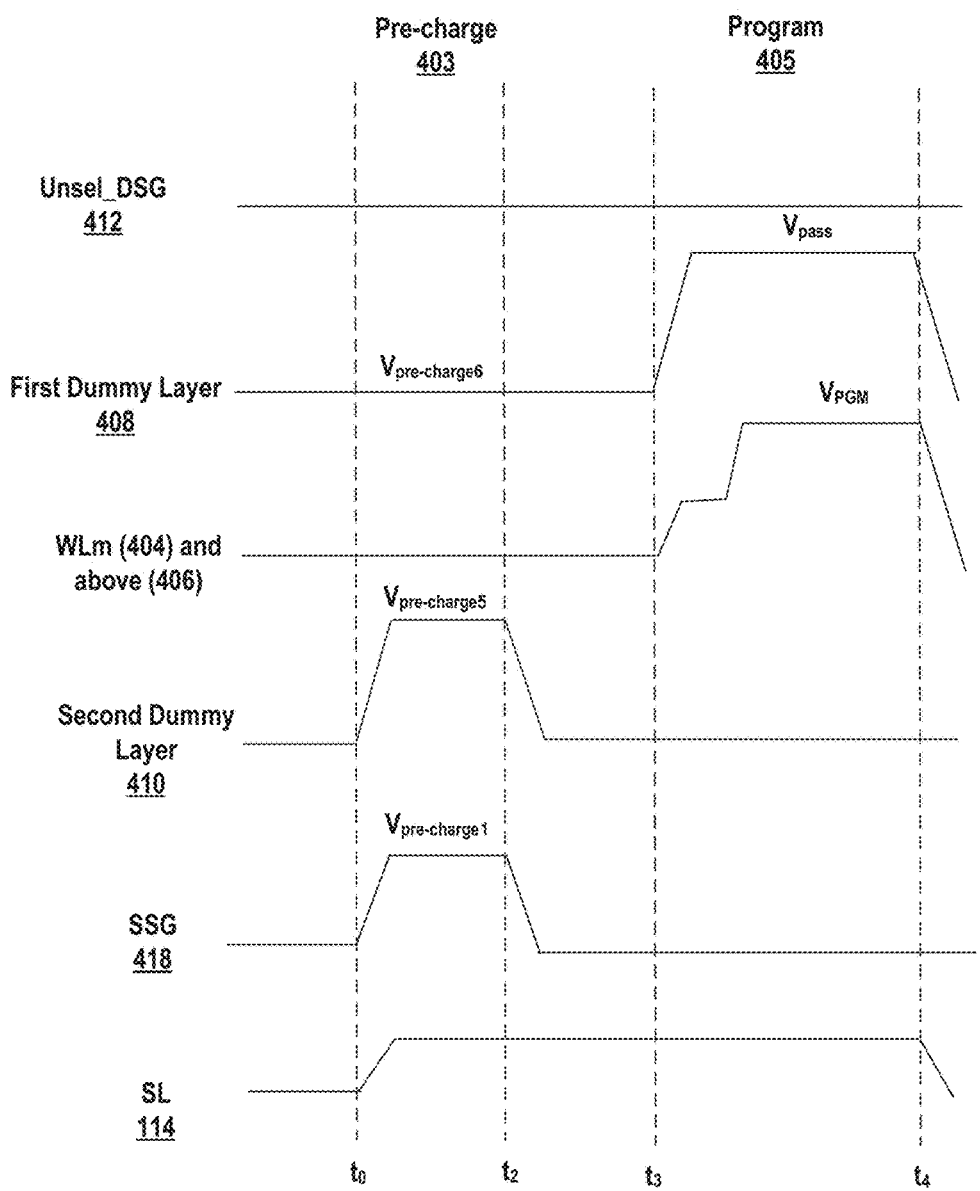
FIG. 4E illustrates a third waveform associated with the reverse pre-charging programming scheme for the 3D NAND memory device, according to some aspects of the present disclosure.
Figure 4F:
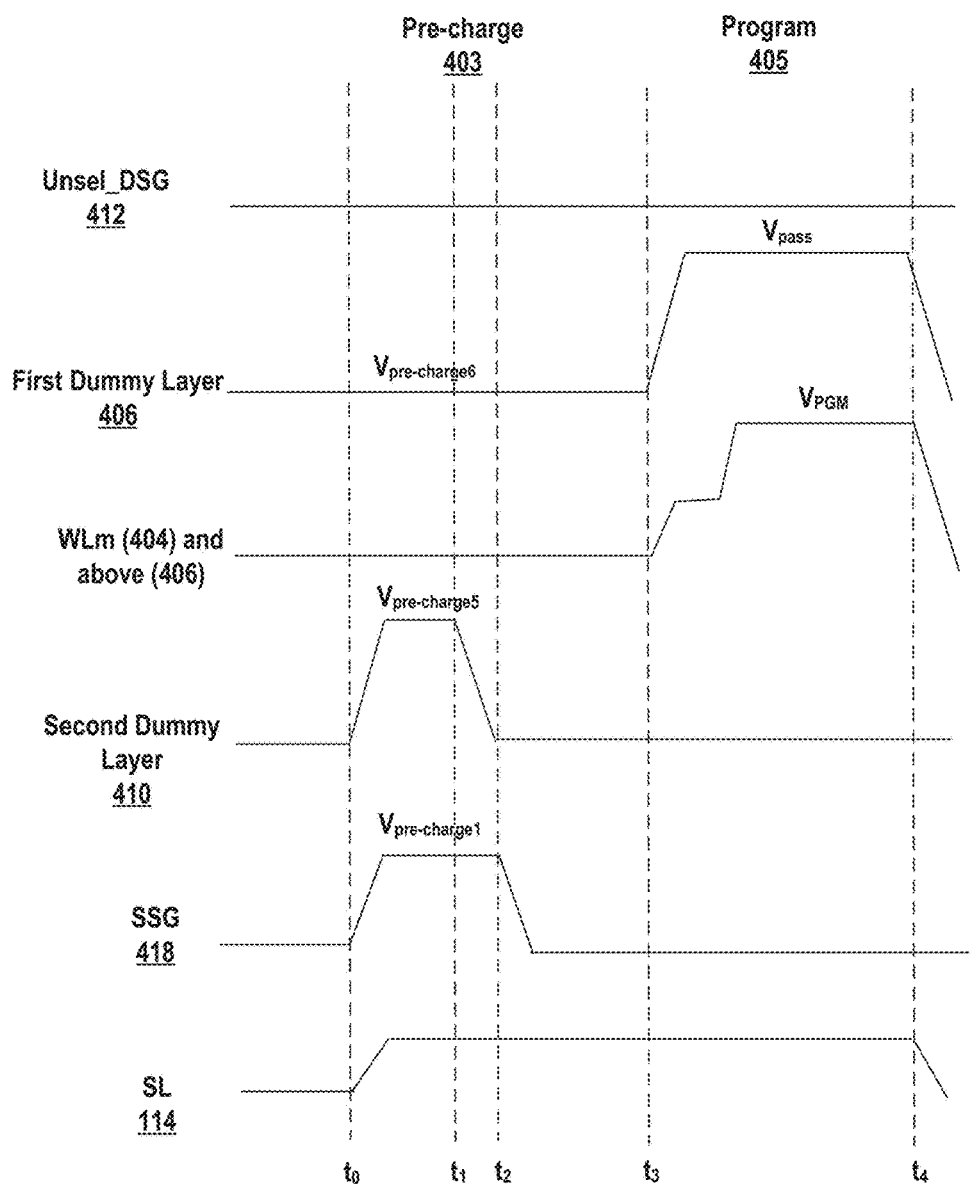
FIG. 4F illustrates a third waveform associated with the reverse pre-charging programming scheme for the 3D NAND memory device, according to some aspects of the present disclosure.

FIG. 4A illustrates a reverse programming scheme for a 3D NAND memory device 400, according to certain aspects of the present disclosure. FIG. 4B illustrates a first programming waveform 401 associated with a first set of memory layers of 3D NAND memory device 400 of FIG. 4A, according to certain aspects of the present disclosure. FIG. 4C illustrates a second programming waveform 415 associated with the first set of memory layers of 3D NAND memory device 400 of FIG. 4A, according to certain aspects of the present disclosure. FIG. 4D illustrates a third programming waveform 417 associated with a second set of 3D NAND memory device 400 of FIG. 4A, according to certain aspects of the present disclosure. FIG. 4E illustrates a fourth programming waveform 419 associated with a second set of memory layers of 3D NAND memory device 400 of FIG. 4A, according to certain aspects of the present disclosure. FIG. 4F illustrates a fifth programming waveform 421 associated with a second set of memory layers of 3D NAND memory device 400 of FIG. 4A, according to certain aspects of the present disclosure. FIGS. 4A-4F will now be described together.

Referring to FIG. 4A, 3D NAND memory device 400 includes a memory stack with, e.g., a plurality of memory layers 402, 404, 406, 408, and 410 (e.g., gate conductive layers) in the vertical direction. In certain implementations, the memory stack may be arranged with a first set of memory layers 404 and a second set of memory layers 406. As illustrated in FIG. 4A, each memory layer in first set of memory layers 404 may be associated with a word line, e.g., such as WL0-WLm. Furthermore, each memory layer in second set of memory layers 406 also may be associated with a word line, e.g., such as WLm+1-WLn.

Still further, each memory layer in 3D NAND memory device 400 may be associated with a programming cycle. A programming cycle may include, among others, a pre-charge period 403 and a program period 405. In the reverse programming direction, the memory layers in a selected NAND memory string 420 may be programmed. To avoid program disturbances in, for example, a deselected NAND memory string 422, pre-charge voltages may be applied to various layers in deselected NAND memory string 422 prior to program period 405.

By way of example and not limitation, the first programming cycle may begin with the memory cell associated with WL0 before moving on to a second programming cycle for the memory cell associated with WL1, and so on. That is, to program the memory cell associated with WL0 in selected NAND memory string 420, pre-charge voltages are first applied to various layers in deselected NAND memory string 422 of 3D NAND memory device 400. Then, a program voltage is applied to WL0 to program the associated first memory cell in selected NAND memory string 420. Once the first memory cell is programmed in selected NAND memory string 420, a programming cycle for the memory cell associated with WL1 may begin. Each time a memory cell is programmed in selected NAND memory string 420, residual electrons may accumulate in a channel 424 (corresponding to semiconductor channel 220 in FIG. 2) of deselected NAND memory string 422 for the reasons mentioned above. Hence, for each subsequent memory layer, pre-charge voltages may be applied to deselected NAND memory string 422 to remove the residual electrons accumulated during program period 405 of the previous memory layer. In this way, program disturbances in deselected NAND memory string 422 may be reduced and/or avoided entirely.

Still referring to FIG. 4A, a first dummy memory layer 408, such as interface dummy word lines (IDMY_L1-IDMY_ul), may be located between first set of memory layers 404 and second set of memory layers 406. As shown in FIG. 4A, 3D NAND memory device 400 also includes a plurality of NAND memory strings (e.g., selected NAND memory string 420 and deselected NAND memory string 422), each extending vertically through the memory stack. Each NAND memory string 420 or 422 includes a drain select gate (DSG) 412 or 414 above third dummy memory layer(s) 402, such as drain dummy word lines (DMY WL). Each NAND memory string 420 or 422 also includes a source select gate (SSG) 416 or 418 below second dummy memory layer(s) 410, such as source dummy word lines (DMY_WL). A reverse programming operation (e.g., programming in the direction from DSG 412/414 to SSG 416/418) may be performed to program one or more memory layers in selected NAND memory string 420. It is understood that each of first, second, and third dummy memory layers 408, 410, and 402 referred to herein may include one or more dummy memory layers.

As illustrated in FIGS. 4B-4F, the reverse programming operation may apply $V_{pre\text{-}charge1}$ to SS8 414 and an SL voltage $V_{SL}$ to SL 114 to turn on deselected NAND memory string 422 during pre-charge period 403. In certain implementations, SSG driving circuit 128 may apply $V_{pre\text{-}charge1}$ to SSG 418 via SSG line 115 that is associated with deselected NAND memory string 422. In certain other implementations, SL driving circuit 130 may apply $V_{BL}$ to BL 116 of deselected NAND memory string 422.

As mentioned above, the reverse programming operation may include a plurality of programming cycles, one for each of the memory layers in 3D NAND memory device 400. Each of the programming cycles may include, among others, pre-charge period 403 and program period 405. In the example(s) illustrated in FIGS. 4B-4F, pre-charge period 403 may be the time period between $t_0$ and $t_3$. During pre-charge period 403, a potential may be created in channel 424 of deselected NAND memory string 422. The potential may draw residual electrons (e.g., located in channel 424 of deselected NAND memory string 422) towards the drain end (e.g., towards SSG 418) by applying various pre-charge voltages to different layers in deselected NAND memory string 422. During the time period between $t_2$ and $t_3$, the pre-charge voltages ramp down prior to program period 405. The program period 405 may be the time period between $t_3$ and $t_4$. During program period 405, an associated memory cell in selected NAND memory string 420 may be programmed, and the coupling potential may be generated in deselected NAND memory string 422 to prevent programming a memory cell in the same memory layer of deselected NAND memory string 422.

Referring to FIGS. 4B-4D, SSG driving circuit 128 may apply a first pre-charge voltage $V_{pre-charge1}$ to SSG 418 of deselected NAND memory string 422 during pre-charge period 403. Furthermore, during pre-charge period 403, WL driving circuit 122 may apply a second pre-charge voltage $V_{pre-charge2}$ to first dummy memory layer 408. As illustrated in FIGS. 4B-4D, $V_{pre-charge2}$ may overlap with $V_{pre-charge1}$. Namely, for at least a portion of pre-charge period 403, $V_{pre-charge2}$ and $V_{pre-charge1}$ may be applied concurrently. At this overlapped time period, the residual electrons can be drawn away from channel 424 of deselected NAND memory string 422 through its drain end. In the example illustrated in FIG. 4B, WL driving circuit 122 may begin ramping down $V_{pre-charge2}$ at the same time SSG driving circuit 128 ramps down $V_{pre-charge1}$, e.g., $t_2$. However, as illustrated in FIGS. 4C and 4D, WL driving circuit 122 may begin ramping down $V_{pre-charge2}$ at $t_1$, prior to DSG driving circuit 126 ramping $V_{pre-charge1}$, which beings at $t_2$. By ramping down $V_{pre-charge2}$ prior to $V_{pre-charge1}$, residual electrons near and/or around first dummy memory layer 408 may be prevented from flowing back towards the lower memory layers.

As also seen in FIGS. 4B-4D, during pre-charge period 403, WL driving circuit 122 may apply a third pre-charge voltage $V_{pre-charge3}$ to second dummy memory layer 410. In certain implementations, $V_{pre-charge3}$ may overlap with $V_{pre-charge1}$ and $V_{pre-charge2}$ during pre-charge period 403. Namely, for at least a portion of pre-charge period 403, $V_{pre-charge3}$, $V_{pre-charge2}$, and $V_{pre-charge1}$ may be applied concurrently. In the example illustrated in FIGS. 4B and 4C, SSG driving circuit 128 and WL driving circuit 122 may begin ramping down $V_{pre-charge1}$ and $V_{pre-charge3}$, respectively, at the same time, e.g., $t_2$. However, in the example illustrated in FIG. 4D, WL driving circuit 122 may begin ramping down $V_{pre-charge3}$ at $t_1$ prior to SSG driving circuit 128 ramping down $V_{pre-charge1}$ at $t_2$. By ramping down $V_{pre-charge3}$ and $V_{pre-charge2}$ prior to $V_{pre-charge1}$, residual electrons may continue to be drawn towards the drain end after the pre-charge voltages are reduced and/or removed from first dummy memory layer 408 and second dummy memory layer 410. In this way, fewer residual electrons may remain in channel 424, and, hence, the chance of program disturbance occurring at the lower memory layers associated with WL0-WLm may be reduced.

Furthermore, as seen in FIGS. 4B-4D, WL driving circuit 122 may apply a fourth pre-charge voltage $V_{pre-charge4}$ to one of first set of memory layers 404 (e.g., associated with one of WL0-WLm) during pre-charge period 403 associated with that programming cycle. $V_{pre-charge4}$ may be applied in such a way that the potential within channel 424 is enhanced, or at least not affected by the application of $V_{pre-charge4}$. For example, $V_{pre-charge4}$ may be less than or equal to 0 V.

However, during each pre-charge period 403 associated with its respective memory cell (e.g., a memory cell associated with one of WLm-WLn), different pre-charge voltages may be applied to second dummy memory layer 410 and first dummy memory layer 408 than those applied during pre-charge period 403 associated with one of the memory cells between WL0-WLm−1. For example, referring to FIGS. 4E and 4F, SSG driving circuit 128 may maintain $V_{pre-charge1}$ at SSG 418, and WL driving circuit 122 may apply a fifth pre-charge voltage $V_{pre-charge5}$ to second dummy memory layer 410. In certain implementations, $V_{pre-charge5}$ and $V_{pre-charge1}$ may be applied concurrently. In certain implementations, WL driving circuit 122 may apply $V_{pre-charge6}$ to first dummy memory layer 408. $V_{pre-charge6}$ may be 0 V or a negative voltage so that the potential within channel 424 draws free electrons away from lower layer memory cells towards SSG 418. In certain implementations, as illustrated in FIG. 4E, WL driving circuit 122 may begin ramping down $V_{pre-charge5}$ at $t_2$ at the same time SSG driving circuit 128 ramping down $V_{pre-charge1}$ at $t_2$. In certain implementations, as illustrated in FIG. 4F, WL driving circuit 122 may begin ramping down $V_{pre-charge5}$ at $t_1$ prior to SSG driving circuit 128 ramping down $V_{pre-charge1}$ at $t_2$.

As seen in FIGS. 4B-4F, during program period 405, for deselected NAND memory string 422, because DSG 414 and SSG 418 at each end thereof are turned off, channel 424 of deselected NAND memory string 422 is in a floating state. During the programming of memory layers in selected NAND memory string 420, because the memory layers of memory pages 120 surround both selected NAND memory string 420 and deselected NAND memory string 422, channel pass voltage $V_{pass}$ applied to each of the rest of the memory layers forms a coupling potential in deselected NAND memory string 422 to suppress the programming of a memory cell in deselected NAND memory string 422 due to the program voltage $V_{PGM}$ used to program a memory cell in selected NAND memory string 420. For example, when $V_{PGM}$ is applied to WLm−1 to program the associated memory cell in selected NAND memory string 420, $V_{pass}$ may be applied to WL0-WLm−2, WLm-WLn, and first dummy memory layer 408. Furthermore, during program period 405, a deselect voltage (e.g., 0V) may be applied to DSG 414 and SSG 418 to deselect NAND memory string 422 while programming the memory cells of selected NAND memory string 420.

Figure 5:
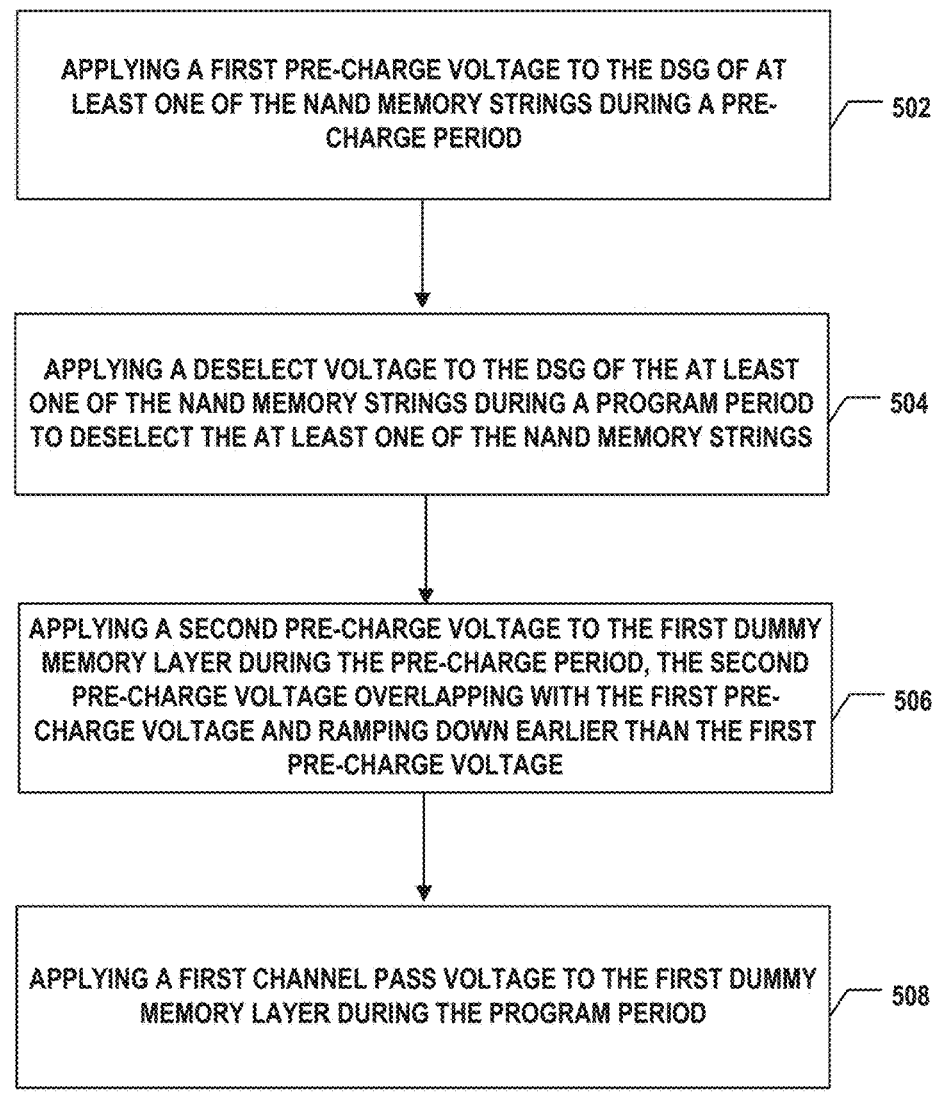
FIG. 5 is a flowchart of an exemplary method for forward pre-charging and programming scheme for a 3D NAND memory device, according to some aspects of the present disclosure.

FIG. 5 is a flowchart of an exemplary method 500 for forward programming a 3D memory device, according to some aspects of the present disclosure. The operations illustrated in FIG. 5 may be performed by a 3D memory device, e.g., such as 3D NAND memory device 300 illustrated in FIG. 3A. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, at 502, the 3D memory device may apply a first pre-charge voltage to the DSG of at least one of the NAND memory strings during a pre-charge period. For example, referring to FIGS. 3A-3C, DSG driving circuit 126 may apply a first pre-charge voltage $V_{pre-charge1}$ to DSG 314 of deselected NAND memory string 322 during pre-charge period 303.

At 504, the 3D memory device may apply a deselect voltage to the DSG of the at least one of the NAND memory strings during a program period to deselect the at least one of the NAND memory strings. For example, referring to FIG. 3D, during program period 305, a deselect voltage (e.g., 0V) may be applied to DSG 314 and SSG 318 to deselect NAND memory string 322 while the memory layers of selected NAND memory string 320 are programmed.

At 506, the 3D memory device may apply a second pre-charge voltage to the first dummy memory layer during the pre-charge period. In certain aspects, the second pre-charge voltage may overlap with the first pre-charge voltage and ramp down prior to the first pre-charge voltage. For example, referring to FIGS. 3B and 3C, during pre-charge period 303, WL driving circuit 122 may apply a second pre-charge voltage $V_{pre-charge2}$ to first dummy memory layer 308. As illustrated in FIG. 3B, $V_{pre-charge2}$ may overlap with $V_{pre-charge1}$. Namely, for at least a portion of pre-charge period 303, $V_{pre-charge2}$ and $V_{pre-charge1}$ may be applied concurrently. However, as illustrated in FIG. 3B, WL driving circuit 122 may begin ramping down $V_{pre-charge2}$ at $t_1$, prior to DSG driving circuit 126 ramping $V_{pre-charge1}$, which beings at $t_2$. By ramping down $V_{pre-charge2}$ prior to $V_{pre-charge1}$, free electrons near and/or around first dummy memory layer 308 may be drawn away from, among others, WLm.

At 508, the 3D memory device may apply a first channel pass voltage to the first dummy memory layer during the program period. For example, referring to FIGS. 3B-3D, During the programming of memory layers in selected NAND memory string 320, because the memory layers of memory pages 120 surround both selected NAND memory string 320 and deselected NAND memory string 322, the channel pass voltage $V_{pass}$ applied to each of the rest of the memory layers in the memory stack forms a coupling potential in deselected NAND memory string 322 to suppress the programming of memory cells in deselected NAND memory string 322 due to the program voltage $V_{PGM}$ applied to memory layer.

Figure 6:
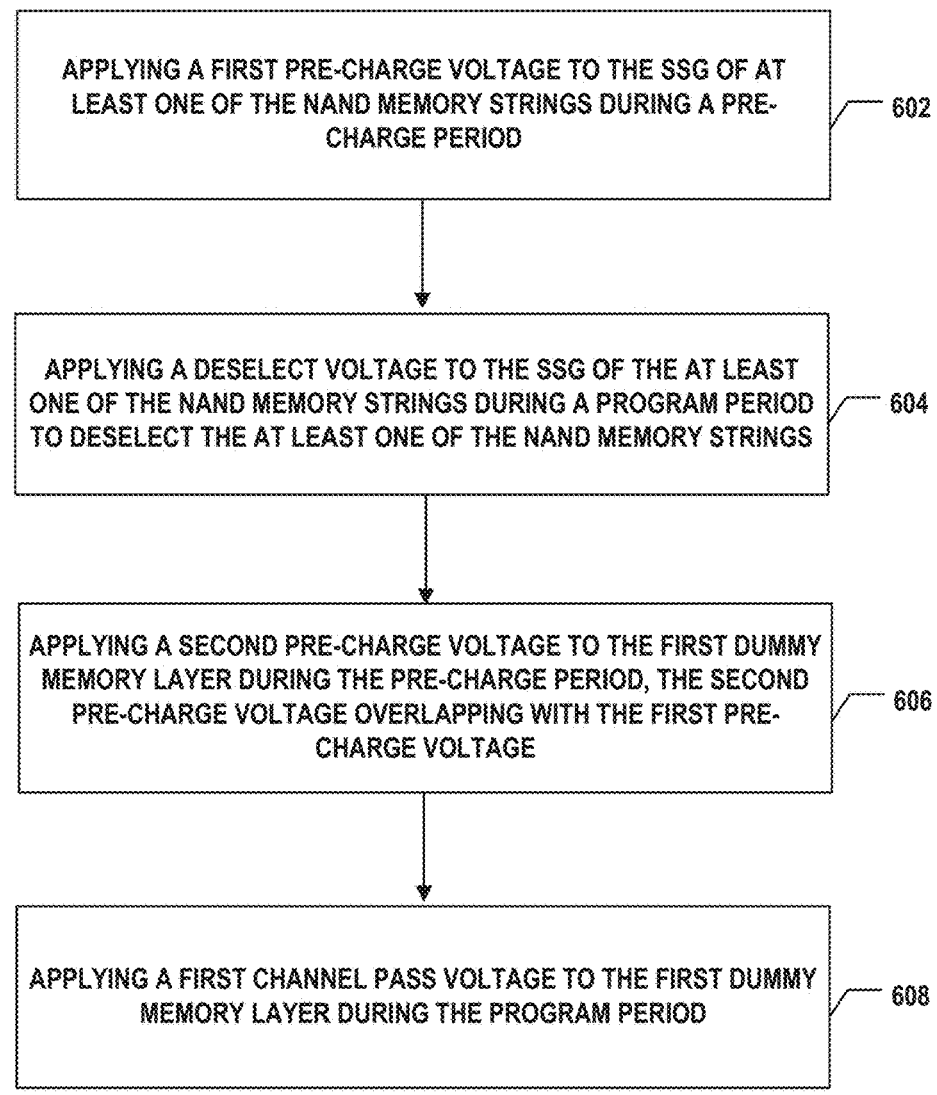
FIG. 6 is a flowchart of an exemplary method for reverse pre-charging and programming scheme for a 3D NAND memory device, according to some aspects of the present disclosure.

FIG. 6 is a flowchart of an exemplary method 500 for reverse programming a 3D memory device, according to some aspects of the present disclosure. The operations illustrated in FIG. 6 may be performed by a 3D memory device, e.g., such as 3D NAND memory device 400 illustrated in FIG. 4A. It is understood that the operations shown in method 600 are not exhaustive and that other operations can be performed as well before, after, or between any of the illustrated operations. Further, some of the operations may be performed simultaneously, or in a different order than shown in FIG. 6.

Referring to FIG. 6, at 602, the 3D memory device may apply a first pre-charge voltage to the SSG of at least one of the NAND memory strings during a pre-charge period. For example, referring to FIGS. 4B-4D, the SSG driving circuit 128 may apply a first pre-charge voltage $V_{pre-charge1}$ to SSG 418 of deselected NAND memory string 422 during pre-charge period 403.

At 604, the 3D memory device may apply a deselect voltage to the SSG of the at least one of the NAND memory strings during a program period to deselect the at least one of the NAND memory strings. For example, referring to FIGS. 4B-4D, during program period 405, a deselect voltage (e.g., 0V) may be applied to DSG 414 and SSG 418 to deselect NAND memory string 422 while the memory layers of selected NAND memory string 420 are programmed.

At 606, the 3D memory device may apply a second pre-charge voltage to the first dummy memory layer during the pre-charge period. In certain aspects, the second pre-charge voltage may overlap with the first pre-charge voltage. For example, referring to FIGS. 4B-4D, during pre-charge period 403, WL driving circuit 122 may apply a second pre-charge voltage $V_{pre-charge2}$ to first dummy memory layer 408. As illustrated in FIG. 4B, $V_{pre-charge2}$ may overlap with $V_{pre-charge1}$. Namely, for at least a portion of pre-charge period 403, $V_{pre-charge2}$ and $V_{pre-charge1}$ may be applied concurrently.

At 608, the 3D memory device may apply a first channel pass voltage to the first dummy memory layer during the program period. For example, referring to FIGS. 4B-4F, During the programming of memory layers in selected NAND memory string 420, because the memory layers of memory pages 120 surround both selected NAND memory string 420 and deselected NAND memory string 422, the channel pass voltage $V_{pass}$ applied to each of the rest of the memory layers in memory stack forms a coupling potential in deselected NAND memory string 422 to suppress the programming of the memory layer in deselected NAND memory string 422 due to the program voltage $V_{PGM}$ applied to memory layer.

According to one aspect of the present disclosure, a 3D memory device is disclosed. In some implementations, the 3D memory device may include a first set of memory layers, a second set of memory layers above the first set of memory layers, and a first dummy memory layer between the first and second memory layers. In certain other aspects, the 3D memory device may include a plurality of NAND memory strings each extending through the first and second set of memory layers and the first dummy memory layer. Each of the NAND memory strings may comprise a DSG above the second set of memory layers. In still other aspects, the 3D memory device may include a peripheral circuit configured to sequentially program each memory layer of the first set of memory layers, and then sequentially program each of the memory layer of the second set of memory layers. The peripheral circuit may include a DSG driving circuit configured to apply a first pre-charge voltage to the DSG of at least one of the NAND memory strings during a pre-charge period, and to apply a deselect voltage to the DSG of the at least one of the NAND memory strings during a program period to deselect the at least one of the NAND memory strings. In certain other aspects, the 3D memory device may include a WL driving circuit that, when programming one of the first set of memory layers, may be configured to apply a second pre-charge voltage to the first dummy memory layer during the pre-charge period. The second pre-charge voltage may overlap with the first pre-charge voltage and ramping down prior to the first pre-charge voltage. The WL driving circuit may be further configured to apply a first channel pass voltage to the first dummy memory layer during the program period.

In some implementations, the 3D memory device may further include a second dummy memory layer between the second set of memory layers and the DSG. In some implementations, the WL driving circuit may be further configured to apply a third pre-charge voltage to the second dummy memory layer during the pre-charge period. The third pre-charge voltage may overlap with the first and second pre-charge voltages.

In some implementations, third pre-charge voltage may ramp down prior to the first pre-charge voltage during the pre-charge period.

In some implementations, the third pre-charge voltage and the second pre-charge voltage may have a same duration.

In some implementations, the WL driving circuit may be further configured to apply a first program voltage to the one of the first set of memory layers during the program period.

In some implementations, the WL driving circuit may be further configured to apply a fourth pre-charge voltage to the one of the first set of memory layers during the pre-charge period. In some implementations, the fourth pre-charge voltage being may be less than or equal to 0 V.

In some implementations, the one of the first set of memory layers may exclude a memory layer of the first set of memory layers that is directly adjacent to the first dummy memory layer.

In some implementations, when programming one of the second set of memory layers, the WL driving circuit may be further configured to apply a fifth pre-charge voltage to the second dummy memory layer during a pre-charge period, the fifth pre-charge voltage overlapping with the first pre-charge voltage.

In some implementations, the fifth pre-charge voltage ramps down prior to the first pre-charge voltage.

In some implementations, when programming the one of the second set of memory layers, the WL driving circuit may be further configured to during a program period, apply a second program voltage to the one of the second set of memory layers, and to apply a second channel pass voltage to the first dummy memory layer.

In some implementations, when programming one of the second set of memory layers, the WL driving circuit may be further configured to apply a sixth pre-charge voltage to the first dummy memory layer during the pre-charge period. In some implementations, the sixth pre-charge voltage may be less than or equal to 0 V.

In some implementations, the 3D memory device may further include a plurality of bit lines connected to the plurality of NAND memory strings, respectively. In some implementations, the peripheral circuit further comprises a BL driving circuit configured to apply a bit line voltage to at least one of the bit lines connected to the deselected at least one of the NAND memory strings during the pre-charge period. In some implementations, the bit line voltage may overlap with the first and second pre-charge voltages.

In another example, the 3D memory device may include a first set of memory layers, a second set of memory layers below the first set of memory layers, and a first dummy memory layer between the first and second memory layers. In certain aspects, the 3D memory device may include a plurality of NAND memory strings each extending through the first and second set of memory layers and the first dummy memory layer. Each of the NAND memory strings may comprise an SSG below the second set of memory layers. In certain other aspects, the 3D memory device may include a peripheral circuit configured to sequentially program each memory layer of the first set of memory layers, and then sequentially program each of the memory layer of the second set of memory layers. In certain aspects, the peripheral circuit may include the SSG driving circuit configured to apply a first pre-charge voltage to the SSG of at least one of the NAND memory strings during a pre-charge period, and to apply a deselect voltage to the SSG of the at least one of the NAND memory strings during a program period to deselect the at least one of the NAND memory strings. In certain aspects, the peripheral circuit may include a WL driving circuit that, when programming one of the first set of memory layers, may be configured to apply a second pre-charge voltage to the first dummy memory layer during the pre-charge period. In certain implementations, the second pre-charge voltage may overlap with the first pre-charge voltage. In still other aspects, the WL driving circuit may be configured to apply a first channel pass voltage to the first dummy memory layer during the program period.

According to one aspect of the present disclosure, a 3D memory device is disclosed. In some implementations, the 3D memory device may include a first set of memory layers, a second set of memory layers below the first set of memory layers, and a first dummy memory layer between the first and second memory layers. In certain aspects, the 3D memory device may include a plurality of NAND memory strings each extending through the first and second set of memory layers and the first dummy memory layer. Each of the NAND memory strings may comprise an SSG below the second set of memory layers. In certain other aspects, the 3D memory device may include a peripheral circuit configured to sequentially program each memory layer of the first set of memory layers, and then sequentially program each of the memory layer of the second set of memory layers. In certain aspects, the peripheral circuit may include the SSG driving circuit configured to apply a first pre-charge voltage to the SSG of at least one of the NAND memory strings during a pre-charge period, and to apply a deselect voltage to the SSG of the at least one of the NAND memory strings during a program period to deselect the at least one of the NAND memory strings. In certain aspects, the peripheral circuit may include a WL driving circuit that, when programming one of the first set of memory layers, may be configured to apply a second pre-charge voltage to the first dummy memory layer during the pre-charge period. In certain implementations, the second pre-charge voltage may overlap with the first pre-charge voltage. In still other aspects, the WL driving circuit may be configured to apply a first channel pass voltage to the first dummy memory layer during the program period.

In some implementations, the second pre-charge voltage may ramp down prior to the first pre-charge voltage.

In some implementations, the 3D memory device may further include a second dummy memory layer between the second set of memory layers and the SSG. In some implementations, WL driving circuit may be further configured to apply a third pre-charge voltage to the second dummy memory layer during the pre-charge period. In some implementations, the third pre-charge voltage may overlap with the first and second pre-charge voltages.

In some implementations, the third pre-charge voltage may ramp down prior to the first pre-charge voltage during the pre-charge period.

In some implementations, the third pre-charge voltage and the second pre-charge voltage have a same duration.

In some implementations, the WL driving circuit may be further configured to apply a first program voltage to the one of the first set of memory layers during the program period.

In some implementations, the WL driving circuit may be further configured to apply a fourth pre-charge voltage to the one of the first set of memory layers during the pre-charge period. In some implementations, the fourth pre-charge voltage may be less than or equal to 0 V.

In some implementations, the one of the first set of memory layers may exclude a memory layer of the first set of memory layers that is directly adjacent to the first dummy memory layer.

In some implementations, when programming one of the second set of memory layers, the WL driving circuit may be further configured to apply a fifth pre-charge voltage to the second dummy memory layer during a pre-charge period, the fifth pre-charge voltage overlapping with the first pre-charge voltage.

In some implementations, the fifth pre-charge voltage ramps down prior to the first pre-charge voltage.

In some implementations, when programming the one of the second set of memory layers, the WL driving circuit may be further configured to during a program period, apply a second program voltage to the one of the second set of memory layers, and to apply a second channel pass voltage to the first dummy memory layer.

In some implementations, when programming one of the second set of memory layers, the WL driving circuit may be further configured to apply a sixth pre-charge voltage to the first dummy memory layer during the pre-charge period, the sixth pre-charge voltage being less than or equal to 0 V.

In some implementations, the 3D memory device may further include a source line connected to the plurality of NAND memory strings, respectively. In some implementations, the peripheral circuit further comprises an SL driving circuit configured to apply a source line voltage to the source line during the pre-charge period and the program period, the source line voltage overlapping with the first and second pre-charge voltages.

According to one aspect of the present disclosure, a method for operating a 3D memory device is disclosed. In some implementations, the 3D memory device may include a first set of memory layers, a second set of memory layers above the first set of memory layers, and a first dummy memory layer between the first and second memory layers, and a plurality of NAND memory strings each extending through the first and second set of memory layers and the first dummy memory layer. In some implementations, each of the NAND memory strings may comprise a DSG above the second set of memory layers. In some implementations, the method may include applying a first pre-charge voltage to the DSG of at least one of the NAND memory strings during a pre-charge period. The method may also include applying a deselect voltage to the DSG of the at least one of the NAND memory strings during a program period to deselect the at least one of the NAND memory strings. Further, the method may also include applying a second pre-charge voltage to the first dummy memory layer during the pre-charge period. In some implementations, the second pre-charge voltage may overlap with the first pre-charge voltage and ramp down prior to the first pre-charge voltage. The method may also include applying a first channel pass voltage to the first dummy memory layer during the program period.

In some implementations, the 3D memory device may further comprise a second dummy memory layer between the second set of memory layers and the DSG. In some implementations, the method may further include applying a third pre-charge voltage to the second dummy memory layer during the pre-charge period. In some implementations, the third pre-charge voltage may overlap with the first and second pre-charge voltages. In some implementations, the third pre-charge voltage may ramp down prior to the first pre-charge voltage during the pre-charge period.

In some implementations, the third pre-charge voltage and the second pre-charge voltage may have a same duration.

In some implementations, the method may further include applying a first program voltage to the one of the first set of memory layers during the program period.

In some implementations, the method may further include applying a fourth pre-charge voltage to the one of the first set of memory layers during the pre-charge period. In some implementations, the fourth pre-charge voltage being may be less than or equal to 0 V.

In some implementations, the one of the first set of memory layers may exclude a memory layer of the first set of memory layers that is directly adjacent to the first dummy memory layer.

In some implementations, the method may further include applying a fifth pre-charge voltage to the second dummy memory layer during a pre-charge period, the fifth pre-charge voltage overlapping with the first pre-charge voltage.

In some implementations, the fifth pre-charge voltage may ramp down prior to the first pre-charge voltage.

In some implementations, the method may further include applying a second program voltage to the one of the second set of memory layers during a program period, and applying a second channel pass voltage to the first dummy memory layer.

In some implementations, the method may further include applying a sixth pre-charge voltage to the first dummy memory layer during the pre-charge period, the sixth pre-charge voltage being less than or equal to 0 V.

In some implementations, the 3D memory device further may comprise a plurality of bit lines connected to the plurality of NAND memory strings. In some implementations, the method may further include applying a bit line voltage to at least one of the bit lines connected to the deselected at least one of the NAND memory strings during the pre-charge period. In some implementations, the bit line voltage may overlap with the first and second pre-charge voltages.

According to one aspect of the present disclosure, a method for operating a 3D memory device is disclosed. In some implementations, the 3D memory device may include a first set of memory layers, a second set of memory layers below the first set of memory layers, and a first dummy memory layer between the first and second memory layers, and a plurality of NAND memory strings each extending through the first and second set of memory layers and the first dummy memory layer. In certain aspects, each of the NAND memory strings may comprise an SSG below the second set of memory layers. In certain aspects, the method may include applying a first pre-charge voltage to the SSG of at least one of the NAND memory strings during a pre-charge period. In certain other aspects, the method may include applying a deselect voltage to the SSG of the at least one of the NAND memory strings during a program period to deselect the at least one of the NAND memory strings. In certain other aspects, the method may include applying a second pre-charge voltage to the first dummy memory layer during the pre-charge period. In certain implementations, the second pre-charge voltage may overlap with the first pre-charge voltage. In certain aspects, the method may include applying a first channel pass voltage to the first dummy memory layer during the program period.

In some implementations, the second pre-charge voltage may ramp down prior to the first pre-charge voltage.

In some implementations, the 3D memory device may further comprise a second dummy memory layer between the second set of memory layers and the SSG. In some implementations, the method may further comprise applying a third pre-charge voltage to the second dummy memory layer during the pre-charge period. In some implementations, the third pre-charge voltage overlapping with the first and second pre-charge voltages.

In some implementations, the third pre-charge voltage may ramp down prior to the first pre-charge voltage during the pre-charge period.

In some implementations, the third pre-charge voltage and the second pre-charge voltage may have a same duration.

In some implementations, the method may further comprise applying a first program voltage to the one of the first set of memory layers during the program period.

In some implementations, the method may further comprise applying a fourth pre-charge voltage to the one of the first set of memory layers during the pre-charge period, the fourth pre-charge voltage being less than or equal to 0 V.

In some implementations, the one of the first set of memory layers excludes a memory layer of the first set of memory layers that is directly adjacent to the first dummy memory layer.

In some implementations, the method may further comprise applying a fifth pre-charge voltage to the second dummy memory layer during a pre-charge period, the fifth pre-charge voltage overlapping with the first pre-charge voltage.

In some implementations, the fifth pre-charge voltages may ramp down prior to the first pre-charge voltage.

In some implementations, the method may further comprise applying a second program voltage to the one of the second set of memory layers, and to apply a second channel pass voltage to the first dummy memory layer.

In some implementations, the method may further comprise applying a sixth pre-charge voltage to the first dummy memory layer during the pre-charge period. In some implementations, the sixth pre-charge voltage may be less than or equal to 0 V.

In some implementations, the 3D memory device may further comprise a source line connected to each of the plurality of NAND memory strings, respectively. In some implementations, the method may further comprise applying a source line voltage to the source line during the pre-charge period and the program period. In some implementations, the source line voltage may overlap with the first and second pre-charge voltages.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a substrate;
a first set of word line (WL) on the substrate;
a second set of WL on the substrate;
an interface dummy WL between the first set and the second set of WL;
a first interlayer WL adjacent to the interface dummy WL; and
a peripheral circuit configured to:
apply a first voltage to the interface dummy WL during a pre-charge period;
program memory cells coupled to a first selected WL of the first set of WL during a first program period;
program memory cells coupled to the first interlayer WL during a second program period; and
program memory cells coupled to a second selected WL of the second set of WL during a third program period,
wherein the first program period is earlier than the second program period, and the second program period is earlier than the third program period.

2. The 3D memory device of claim 1, wherein the first voltage comprises a ground voltage or a first pre-charge voltage, and the pre-charge period comprises a first pre-charge period or a second pre-charge period.

3. The 3D memory device of claim 2, wherein applying the first voltage to the interface dummy WL during the pre-charge period comprises applying the first pre-charge voltage to the interface dummy WL during the first pre-charge period, wherein the first pre-charge period is in a time period before programming memory cells coupled to the first selected WL of the first set of WL.

4. The 3D memory device of claim 2, wherein applying the first voltage to the interface dummy WL during the pre-charge period comprises applying the ground voltage to the interface dummy WL during the second pre-charge period, wherein the second pre-charge period is in a time period before programming memory cells coupled to at least the second selected WL of the second set of WL or the first interlayer WL.

5. The 3D memory device of claim 1, wherein the first interlayer WL is between the first set of WL and the interface dummy WL, or the first interlayer WL is between the second set of WL and the interface dummy WL.

6. The 3D memory device of claim 1, wherein the peripheral circuit is further configured to:
sequentially program memory cells coupled to each of the first set of WL from a first WL of the first set of WL to a last WL of the first set of WL, the first interlayer WL, and each of the second set of WL from a first WL of the second set of WL to a last WL of the second set of WL.

7. The 3D memory device of claim 2, further comprising:
a first select gate line, wherein the first set of WL are between the first select gate line and the interface dummy WL; and
a second select gate line, wherein the second set of WL are between the second select gate line and the interface dummy WL, wherein the peripheral circuit is configured to:
apply a second select gate pre-charge voltage to the second select gate line during the pre-charge period.

8. The 3D memory device of claim 7, wherein applying the first voltage to the interface dummy WL during the pre-charge period comprises applying the first pre-charge voltage to the interface dummy WL during the first pre-charge period, wherein the first pre-charge period is in a time period before programming memory cells coupled to the first selected WL of the first set of WL, wherein the peripheral circuit is configured to: start ramping down from the first pre-charge voltage to ground before starting ramping down from the second select gate pre-charge voltage to ground during the first pre-charge period.

9. The 3D memory device of claim 8, wherein applying the second select gate pre-charge voltage and the first pre-charge voltage are overlapped in time.

10. The 3D memory device of claim 2, further comprising:
 a first dummy WL, wherein the first set of WL are between the first dummy WL and the interface dummy WL; and
 a second dummy WL, wherein the second set of WL are between the second dummy WL and the interface dummy WL, wherein the peripheral circuit is configured to:
  apply a second dummy pre-charge voltage to the second dummy WL during the pre-charge period.

11. The 3D memory device of claim 10, wherein applying the first voltage to the interface dummy WL during the pre-charge period comprises applying the first pre-charge voltage to the interface dummy WL during the first pre-charge period, wherein the first pre-charge period is in a time period before programming memory cells coupled to the first selected WL of the first set of WL, wherein applying the second dummy pre-charge voltage and the first pre-charge voltage are overlapped in time.

12. The 3D memory device of claim 11, wherein the peripheral circuit is configured to: start ramping down from the first pre-charge voltage to ground before starting ramping down from the second dummy pre-charge voltage to ground during the first pre-charge period.

13. The 3D memory device of claim 11, wherein the peripheral circuit is configured to: start ramping down from the first pre-charge voltage to ground and start ramping down from the second dummy pre-charge voltage to ground at the same time.

14. The 3D memory device of claim 11, wherein the peripheral circuit is configured to: start ramping down from the second dummy pre-charge voltage to ground before starting ramping down from a second select gate pre-charge voltage applied to a second select gate line to ground during the first pre-charge period.

15. The 3D memory device of claim 3, wherein the peripheral circuit is configured to: apply a channel pass voltage to the interface dummy WL during the first program period, wherein the channel pass voltage is higher than the first pre-charge voltage.

16. The 3D memory device of claim 3, wherein the peripheral circuit is configured to: apply a second pre-charge voltage to the first selected WL of the first set of WL during the first pre-charge period, wherein the second pre-charge voltage is less than or equal to 0 V.

17. The 3D memory device of claim 2, wherein the peripheral circuit is configured to: apply a signal line pre-charge voltage to a signal line during the pre-charge period, wherein the signal line is a bit line or a source line.

18. A method for operating a three-dimensional (3D) memory device, wherein the 3D memory device comprises:
 a substrate;
 a first set of word line (WL) on the substrate;
 a second set of WL on the substrate;
 an interface dummy WL between the first set and the second set of WL;
 a first interlayer WL adjacent to the interface dummy WL, and wherein the method comprises:
  applying a first voltage to the interface dummy WL during a pre-charge period;
  programming memory cells coupled to a first selected WL of the first set of WL during a first program period;
  programming memory cells coupled to the first interlayer WL during a second program period; and
  programming memory cells coupled to a second selected WL of the second set of WL during a third program period,
  wherein the first program period is earlier than the second program period, and the second program period is earlier than the third program period,
  wherein in response to a forward program, the first interlayer WL is between the first set of WL and the interface dummy WL, and in response to a reverse program, the first interlayer WL is between the second set of WL and the interface dummy WL.

19. The method of claim 18, wherein the first voltage comprises a ground voltage or a first pre-charge voltage, and the pre-charge period comprises a first pre-charge period or a second pre-charge period.

20. The method of claim 19, wherein applying the first voltage to the interface dummy WL during the pre-charge period comprises applying the first pre-charge voltage to the interface dummy WL during the first pre-charge period, and
 wherein the first pre-charge period is in a time period before programming memory cells coupled to the first selected WL of the first set of WL.

21. The method of claim 19, wherein applying the first voltage to the interface dummy WL during the pre-charge period comprises applying the ground voltage to the interface dummy WL during the second pre-charge period, and
 wherein the second pre-charge period is in a time period before programming memory cells coupled to at least the second selected WL of the second set of WL or the first interlayer WL.

22. A three-dimensional (3D) memory device, comprising:
 a substrate;
 a first set of word line (WL) on the substrate;
 a second set of WL on the substrate;
 an interface dummy WL between the first set and the second set of WL;
 a first interlayer WL adjacent to the interface dummy WL; and
 a peripheral circuit configured to:
  apply a first voltage to the interface dummy WL during a pre-charge period;
  program memory cells coupled to a first selected WL of the first set of WL during a first program period;
  program memory cells coupled to the first interlayer WL during a second program period; and
  program memory cells coupled to a second selected WL of the second set of WL during a third program period,
  wherein the first program period is earlier than the second program period, and the second program period is earlier than the third program period,
  wherein in response to a forward program, the first interlayer WL is between the first set of WL and the interface dummy WL, and in response to a reverse program, the first interlayer WL is between the second set of WL and the interface dummy WL.

\* \* \* \* \*